(12) United States Patent
Wang

(10) Patent No.: US 11,796,610 B2
(45) Date of Patent: Oct. 24, 2023

(54) COMPOSITIONS AS MOLECULAR TAGS FOR HYPERPOLARIZATION NMR AND MAGNETIC RESONANCE AND METHODS OF MAKING AND USING SAME

(71) Applicant: Duke University, Durham, NC (US)

(72) Inventor: Qiu Wang, Durham, NC (US)

(73) Assignee: Duke University, Durham, NC (US)

( * ) Notice: Subject to any disclaimer, the term of this patent is extended or adjusted under 35 U.S.C. 154(b) by 1234 days.

(21) Appl. No.: 16/298,621

(22) Filed: Mar. 11, 2019

(65) Prior Publication Data

US 2019/0277925 A1 Sep. 12, 2019

Related U.S. Application Data

(60) Provisional application No. 62/640,851, filed on Mar. 9, 2018.

(51) Int. Cl.
*G01R 33/28* (2006.01)
*G01R 33/30* (2006.01)

(52) U.S. Cl.
CPC ......... *G01R 33/282* (2013.01); *G01R 33/302* (2013.01)

(58) Field of Classification Search
None
See application file for complete search history.

(56) References Cited

U.S. PATENT DOCUMENTS 9,790,245 B2  10/2017  Chekmenev
2016/0169998 A1  6/2016  Warren

FOREIGN PATENT DOCUMENTS

CN  107522673 A  12/2017

OTHER PUBLICATIONS

Zhao, R., et al., "Progress in Quantitative MRI and Hyperpolarization NMR Research", Duke Thesis, pp. 1-51 (Year: 2017).*
Qing, Y., et al., "Bioorthogonal CycloadditionswithSub-Millisecond Intermediates", Angew. Chem. Int. Ed., pp. 1218-1221; Dec. 14, 2017 (Year: 2017).*
Manalo, M.N., et al., "Solvent Effects on 15N NMR Shielding of 1,2,4,5-Tetrazine and Isomeric Tetrazoles: Continuous Set Gauge Transformation Calculation Using the Polarizable Continuum Model", J. Phys. Chem., pp. 9600-9604 (Year: 2000).*
Ni, Q.Z., et al., "High Frequency Dynamic Nuclear Polarization", Accts. Chem. Res., pp. 1933-1941 (Year: 2012).*
Lycka, A., et al., "A 15N NMR study of tautomerism in dimethyl dihydro-1,2,4,5-tetrazine-3,6-dicarboxylate" Tetrahedron Letters, pp. 4213-4215 (Year: 2008).*
Bae et al., "15N4-1,2,4,5-tetrazines as potential molecular tags: Integrating bioorthogonal chemistry with hyperpolarization and unearthing para-N2," Science Advances 4(3): eaar2978 (2018).
Oliveira et al. "Inverse electron demand Diels-Alder reactions in chemical biology," Chem. Soc. Rev. 46(16): 4895-4950 (2017).
Row et al., "Constructing New Bioorthogonal Reagents and Reactions," Acc. Chem. Res. 51(5): 1073-1081 (2018).
Wu et al., "Advances in Tetrazine Bioorthogonal Chemistry Driven by the Synthesis of Novel Tetrazines and Dienophiles," Acc. Chem. Res. 51(5): 1249-1259 (2018).
Theis et al., "Direct and cost-efficient hyperpolarization of long-lived nuclear spin states on universal 15N2-diazirine molecular tags," Sci. Adv. 2(3): e1501438 (2016).
Manke, Kara. "MRI Tags Stick to Molecules with Chemical 'Velcro®'," Duke Research Blog; published Mar. 9, 2018; available from https://researchblog.duke.edu/2018/03/09/mri-tags-stick-to-molecules-with-chemical-velcro/.

* cited by examiner

*Primary Examiner* — Michael G. Hartley
*Assistant Examiner* — Lance W Rider
(74) *Attorney, Agent, or Firm* — POLSINELLI PC

(57) ABSTRACT

This disclosure relates to hyperpolarized probes for use in magnetic resonance studies of biological systems.

14 Claims, 11 Drawing Sheets

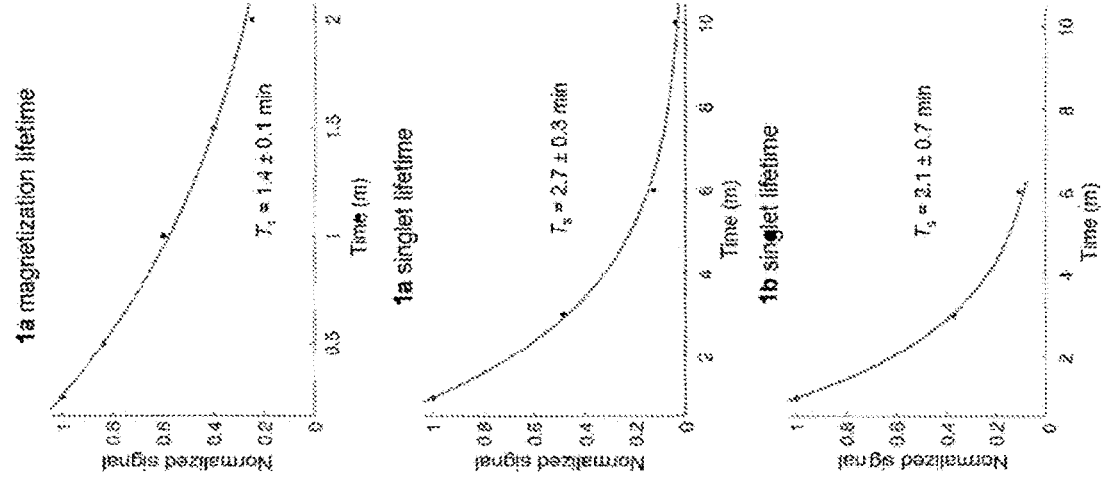
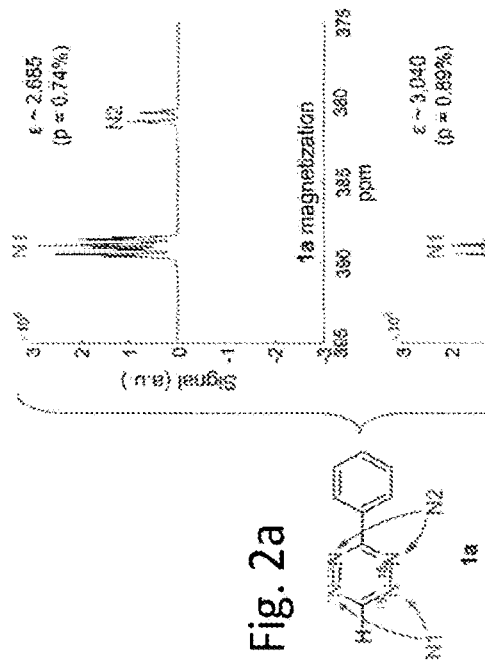
Fig. 2a  Fig. 2b  Fig. 2c

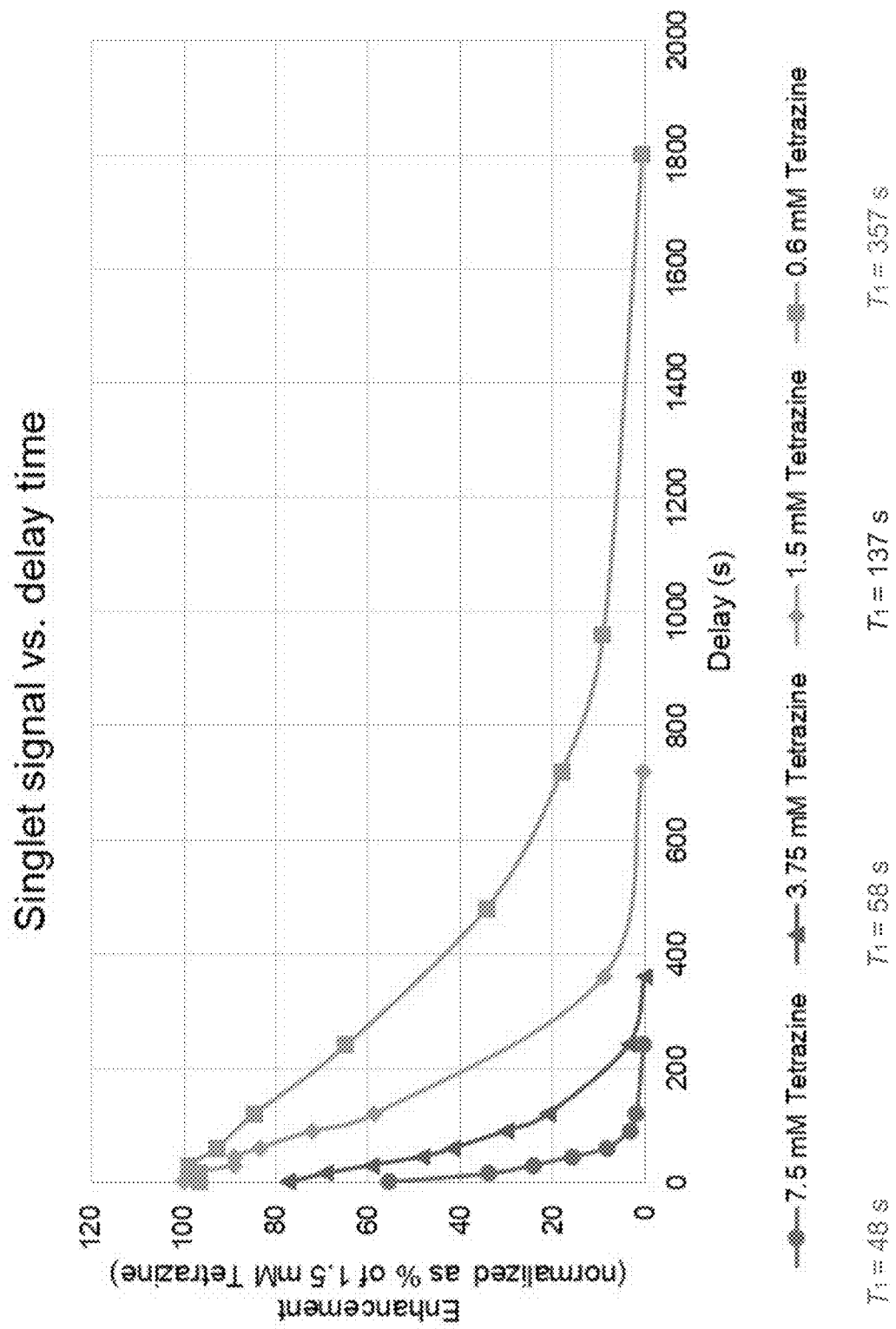

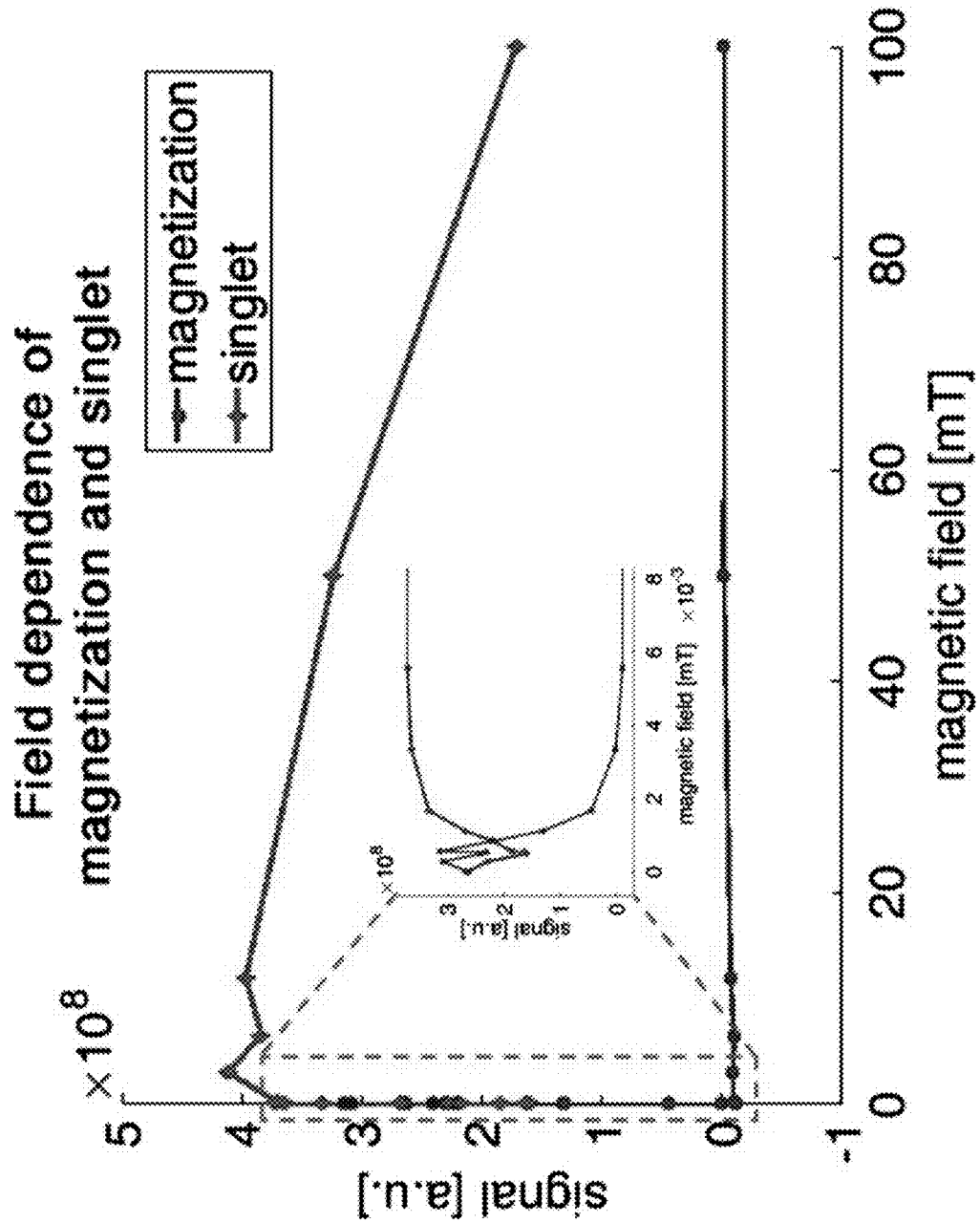

COMPOSITIONS AS MOLECULAR TAGS FOR HYPERPOLARIZATION NMR AND MAGNETIC RESONANCE AND METHODS OF MAKING AND USING SAME

CROSS-REFERENCE TO RELATED APPLICATIONS

This application claims the benefit of priority to U.S. Provisional Application No. 62/640,851, filed Mar. 9, 2018, the disclosure of which is incorporated herein by reference in its entirety.

BACKGROUND OF THE DISCLOSURE

Field of the Disclosure

This disclosure relates to hyperpolarized probes for use in magnetic resonance studies of biological systems.

Technical Background

Hyperpolarized magnetic resonance (HP-MR) has been developed to overcome the low sensitivity of conventional magnetic resonance, a limitation that arises from poor nuclear magnetization at thermal equilibrium. For example, at 7 Tesla and 310° K, equilibrium $^1$H nuclear magnetization is just 0.0024%; other interesting nuclei, such as $^{13}$C and $^{15}$N have even lower gyromagnetic ratios, and thus their MR detection is even more challenging. Hyperpolarization techniques induce non-equilibrium magnetization of target nuclei and therefore raise detectable signals by multiple orders of magnitude. Particularly attractive is hyperpolarized magnetic resonance imaging (HP-MRI) using heteronuclei (e.g., $^{13}$O or $^{15}$N), which offers more comprehensive structural information than $^1$H-NMR and allows signal detection for extended periods of time due to the longer relaxation times of these nuclei compared to $^1$H. Examples geared toward tracing metabolism and biological function in living organisms include endogenous molecular species and derivatives, such as pyruvate, glucose, and amino acids. Other molecular probes include $^{15}$N-pyridine derivatives for measuring pH and $^{13}$C-labeled drugs for tracking pharmacokinetics.

Despite these advances, typical hyperpolarized probes, when subjected to in vivo applications, often readily undergo multiple metabolic pathways and cannot be directed to specific targets with high chemical selectivity. Furthermore, current HP-MRI relies mainly on ex vivo hyperpolarization of molecular targets. Exploiting HP-MRI for endogenous macromolecules in living systems remains an important yet unsolved challenge.

SUMMARY OF THE DISCLOSURE

One aspect of the disclosure provides methods of preparing a hyperpolarized target molecule and/or hyperpolarized $^{15}$N$_2$ gas. Such methods comprise, consist of, or consist essentially of: contacting (1) a target molecule comprising a bioorthogonal reactive moiety with (2) a bioorthogonal tag comprising hyperpolarized $^{15}$N atoms under conditions suitable for the bioorthogonal reactive moiety to undergo a coupling reaction with the biorthogonal tag to produce a hyperpolarized target molecule and/or hyperpolarized $^{15}$N$_2$ gas.

Another aspect of the disclosure provides sensors or sensing molecules suitable for use in magnetic resonance imaging. For example, one aspect of the disclosure provides sensors that comprise, consist of, or consist essentially of: a hyperpolarized target molecule prepared by methods of the disclosure as provided herein. For example, in certain embodiments, the hyperpolarized target molecule comprises the following group:

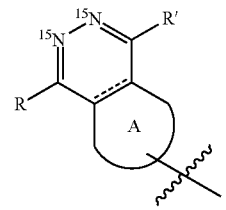

where R and R' are as described below with respect to formula (I), and ring A is a reaction product of the coupling reaction of the bioorthogonal reactive moiety. Yet another aspect of the disclosure provides sensors comprising hyperpolarized $^{15}$N$_2$ gas prepared by methods of the disclosure as provided herein.

The disclosure also provides methods for using the sensors of the disclosure. For example, one aspect of the disclosure provides methods of in vitro or in vivo sensing. Such methods comprise, consist of, or consist essentially of: providing (1) a target molecule comprising a bioorthogonal reactive moiety and (2) a bioorthogonal tag comprising hyperpolarized $^{15}$N atoms to a sample or a subject, under conditions suitable for the bioorthogonal reactive moiety to undergo a coupling reaction with the biorthogonal tag to produce hyperpolarized target molecule and hyperpolarized $^{15}$N$_2$ gas;

allowing for at least a portion of the hyperpolarized target molecule and/or hyperpolarized $^{15}$N$_2$ gas to be modulated in the sample or the subject; and detecting hyperpolarized $^{15}$N atoms by $^{15}$N-magnetic resonance to determine modulation.

Another aspect of the disclosure provides methods of labeling biomolecules with a hyperpolarized moiety. These methods comprise, consist of, or consist essentially of: contacting the biomolecule having a partner moiety with the hyperpolarized target molecule prepared according to methods of the disclosure as provided herein under conditions suitable for the hyperpolarized target molecule to bind to the partner moiety to produce the biomolecule labeled with the hyperpolarized moiety. In certain embodiments, the suitable biomolecules that can be labeled by the methods of the disclosure include, but are not limited to, proteins, nucleic acids, carbohydrates, glycan, lipids, cell membranes, as well as small molecules such as primary metabolites, secondary metabolites, and natural products.

Another aspect of the disclosure provides compositions comprising, or consisting of, or consisting essentially of: a hyperpolarized $^{15}$N-1,2,4,5-tetrazine of formula (I) and an acceptable medium, wherein the $^{15}$N-1,2,4,5-tetrazine of formula is:

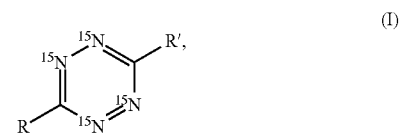

(I)

wherein

R is selected from hydrogen, deuterium, —CN, $C_1$-$C_{12}$ alkyl optionally substituted with one or more $R^1$, $C_2$-$C_{12}$ alkenyl optionally substituted with one or more $R^1$, $C_2$-$C_{12}$ alkynyl optionally substituted with one or more $R^1$, $C_3$-$C_{12}$ cycloalkyl optionally substituted with one or more $R^2$, aryl optionally substituted with one or more $R^2$, and heteroaryl optionally substituted with one or more $R^2$, where each $R^1$ is independently selected from deuterium, halogen, —CN, —$N_3$, —$N(R^5)_2$, and —$OR^5$, each $R^2$ is independently selected from deuterium, halogen, —CN, —$N_3$, $C_1$-$C_6$ alkyl, $C_2$-$C_6$ alkenyl, $C_2$-$C_6$ alkynyl, $C_1$-$C_6$ haloalkyl, —$N(R^5)_2$, and —$OR^5$; and R' is selected from hydrogen, deuterium, —CN, $C_1$-$C_{12}$ alkyl optionally substituted with one or more $R^3$, $C_2$-$C_{12}$ alkenyl optionally substituted with one or more $R^3$, $C_2$-$C_{12}$ alkynyl optionally substituted with one or more $R^3$, $C_1$-$C_6$ haloalkyl, $C_3$-$C_{12}$ cycloalkyl optionally substituted with one or more $R^4$, aryl optionally substituted with one or more $R^4$, and heteroaryl optionally substituted with one or more $R^4$, where each $R^3$ is independently selected from deuterium, halogen, —CN, —$N_3$, —$N(R^5)_2$, and —$OR^5$, each $R^4$ is independently selected from deuterium, halogen, —CN, —$N_3$, $C_1$-$C_6$ alkyl, $C_2$-$C_6$ alkenyl, $C_2$-$C_6$ alkynyl, $C_1$-$C_6$ haloalkyl, —$N(R^5)_2$, and —$OR^5$, wherein each $R^5$ is independently hydrogen, deuterium, or $C_1$-$C_6$ alkyl.

BRIEF DESCRIPTION OF THE DRAWINGS

The accompanying drawings are included to provide a further understanding of the methods and materials of the disclosure, and are incorporated in and constitute a part of this specification. The drawings illustrate one or more embodiment(s) of the disclosure and, together with the description, serve to explain the principles and operation of the disclosure.

FIG. 2a shows structures of $^{15}N_4$-1,2,4,5-tetrazines 1a and 1b.

FIG. 2b shows single-shot hyperpolarized spectra of tetrazines 1a and 1b at magnetization or singlet modes, with peak identifications, observed enhancement (ε), and polarization level (p).

FIG. 2c shows $T_1$ and $T_s$ lifetime curves for tetrazines 1a and 1b.

FIG. 6b is a graph of hyperpolarized signal decay of singlet at variable concentrations.

FIG. 7 is a graph of hyperpolarization of magnetization and singlet as a function of magnetic field.

FIG. 9 shows small-tip-angle spectra of the hyperpolarized cycloaddition product 3a.

DETAILED DESCRIPTION

Figures 1A, 1B:
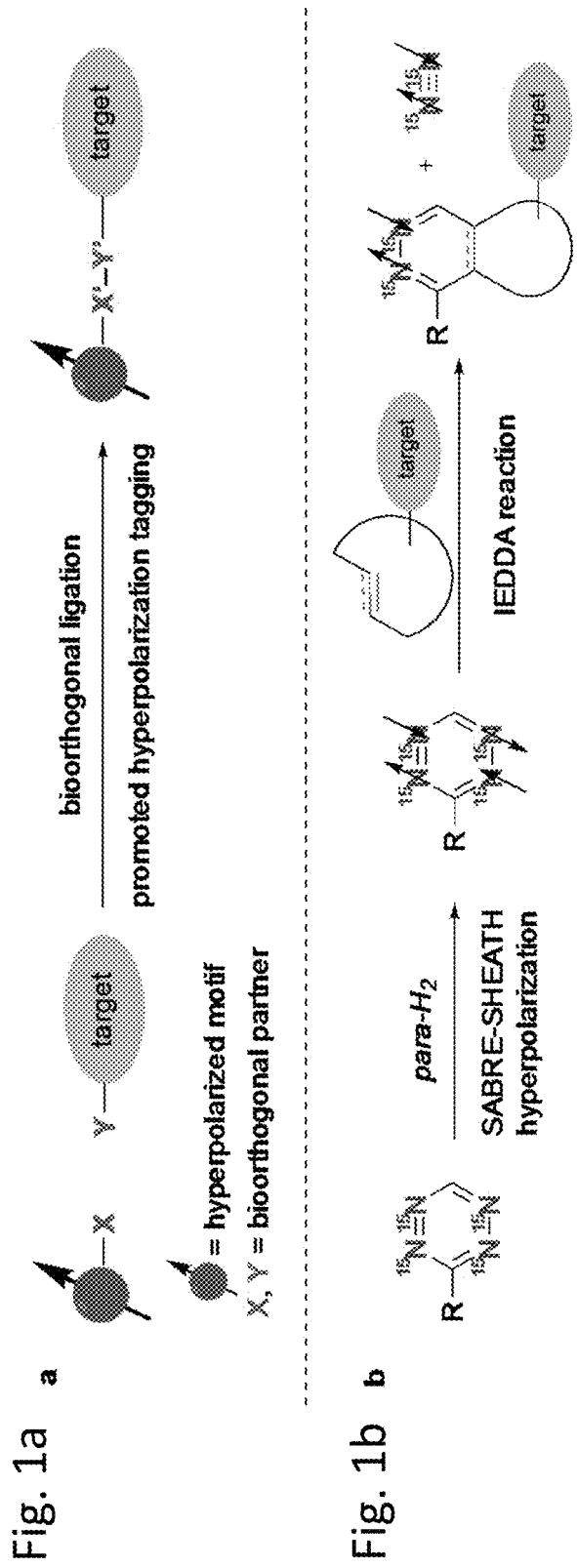
FIG. 1a is an illustration of spin hyperpolarized tagging via bioorthogonal chemistry.
FIG. 1b depicts $^{15}N_4$-1,2,4,5-tetrazine as a molecular tag and its dual roles in hyperpolarization and bioorthogonal ligation.

For the purposes of promoting an understanding of the principles of the present disclosure reference will now be made to preferred embodiments and specific language will be used to describe the same. It will nevertheless be understood that no limitation of the scope of the disclosure is thereby intended, such alteration and further modifications of the disclosure as illustrated herein, being contemplated as would normally occur to one skilled in the art to which the disclosure relates.

Hyperpolarized magnetic resonance is a powerful, sensitive, and noninvasive approach to visualize molecular structure, function, and dynamics in vitro and in vivo. Current applications of HP-MR mostly rely on hyperpolarization of target compounds in dedicated hyperpolarizers, as biomolecules can typically not be hyperpolarized directly in vivo. The injected hyperpolarized probes often undergo multiple metabolic pathways in living systems and it remains challenging to localize and identify specific targets with high chemical selectivity. The inventors, however, have found a solution to the difficulties with HP-MR. Specifically, the inventors found a novel hyperpolarization tagging strategy that integrates bioorthogonal chemistry and hyperpolarization to achieve specific hyperpolarization of targets.

Bioorthogonal chemistry is a powerful approach for the study of biomolecules in real time in living systems. It relies on rapid chemical ligation reactions between two bioorthogonal functional groups that are added to a biological sample. Importantly, these two bioorthogonal partners react with each other in a chemoselective manner, which means that they are inert to any other chemical entity present. Thus, the methods and reagents disclosed herein for bioorthogonal reaction-based hyperpolarization tagging can selectively highlight and localize a target-containing bioorthogonal partners. This combination of hyperpolarized MR with bioorthogonal chemistry enables molecular tracking of any biomolecule with the high signal-to-noise afforded by hyperpolarization, simply by tagging it with the hyperpolarized reaction partner.

Thus, one aspect of the disclosure provides methods of preparing a hyperpolarized target molecule and/or hyperpolarized $^{15}N_2$ gas. Such methods comprise, consist of, or consist essentially of: contacting (1) a target molecule comprising a bioorthogonal reactive moiety with (2) a bioorthogonal tag comprising hyperpolarized $^{15}N$ atoms under conditions suitable for the bioorthogonal reactive moiety to undergo a coupling reaction with the biorthogonal tag to produce the hyperpolarized target and/or hyperpolarized $^{15}N_2$ gas.

In certain embodiments, the methods of the disclosure as provided herein are used to prepare hyperpolarized $^{15}N_2$ gas.

In certain embodiments, the methods of the disclosure as provided herein are used to prepare the hyperpolarized target.

In certain embodiments, the methods of the disclosure as provided herein are used to prepare the hyperpolarized target and hyperpolarized $^{15}N_2$ gas.

The methods of the disclosure allow for selective preparation of two spin isomers of $^{15}N_2$: para-$^{15}N_2$ and ortho-$^{15}N_2$. In certain embodiments, the methods of the disclosure are particularly useful in preparing the hyperpolarized para-$^{15}N_2$ spin isomer. Para-$^{15}N_2$ gas is a biologically and medically innocuous gas with mathematical properties similar to para-$H_2$. While para-$^{15}N_2$ has no net signal, even weak transient bindings to transition metal catalysts (including some biocatalysts) can unlock the spin order and create magnetization. Therefore, hyperpolarized para-$^{15}N_2$ gas provides a great potential for HP-MRI.

As provided above, the methods of the disclosure use a bioorthogonal tag comprising hyperpolarized $^{15}N$ atoms. To obtain the hyperpolarized biorthogonal tag, a $^{15}N$-enriched bioorthogonal tag molecule may be hyperpolarized by the hyperpolarization procedures known in the art. For example, the $^{15}N$ atoms may be hyperpolarized by signal amplification by reversible exchange (SABRE) method. For example, the $^{15}N$ atoms may be hyperpolarized by signal amplification by reversible exchange in shield enables alignment transfer to heteronuclei (SABRE-SHEATH) method using para-$H_2$ (p-$H_2$). Suitable hyperpolarization methods include those provided in U.S. Pat. No. 9,790,245 B2 and U.S. Patent Application Publication no. 2016/0169998 A1, incorporated herein by reference in their entirety. The $^{15}N$ atoms may be hyperpolarized by dynamic nuclear polarization (DNP) method.

The inventors have found that 1,2,4,5-tetrazines are particularly advantageous for use in the methods as disclosed herein because of their dual role in both hyperpolarization and bioorthogonal reactions. Hyperpolarization of $^{15}N$-enriched tetrazines can be achieved by standard hyperpolarization methods, such as SABRE-SHEATH. In addition, hyperpolarized 1,2,4,5-tetrazines react selectively and rapidly with strained azadienophiles via an inverse-demand Diels-Alder reaction (IEDDA). IEDDA reactions have been reported to be among the fastest of known bioorthogonal reactions resulting in hyperpolarized $^{15}N_2$-containing cycloaddition products and hyperpolarized $^{15}N_2$ gas.

Particularly useful $^{15}N$-1,2,4,5-tetrazines of the disclosure are compounds of formula (I):

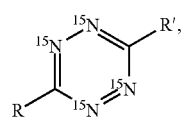

(I)

wherein

R is selected from hydrogen, deuterium, —CN, $C_1$-$C_{12}$ alkyl optionally substituted with one or more $R^1$, $C_2$-$C_{12}$ alkenyl optionally substituted with one or more $R^1$, $C_2$-$C_{12}$ alkynyl optionally substituted with one or more $R^1$, $C_3$-$C_{12}$ cycloalkyl optionally substituted with one or more $R^2$, aryl optionally substituted with one or more $R^2$, and heteroaryl optionally substituted with one or more $R^2$, where each $R^1$ is independently selected from deuterium, halogen, —CN, —$N_3$, —$N(R^5)_2$, and —$OR^5$, each $R^2$ is independently selected from deuterium, halogen, —CN, —$N_3$, $C_1$-$C_6$ alkyl, $C_2$-$C_6$ alkenyl, $C_2$-$C_6$ alkynyl, $C_1$-$C_6$ haloalkyl, —$N(R^5)_2$, and —$OR^5$; and R' is selected from hydrogen, deuterium, —CN, $C_1$-$C_{12}$ alkyl optionally substituted with one or more $R^3$, $C_2$-$C_{12}$ alkenyl optionally substituted with one or more $R^3$, $C_2$-$C_{12}$ alkynyl optionally substituted with one or more $R^3$, $C_1$-$C_6$ haloalkyl, $C_3$-$C_{12}$ cycloalkyl optionally substituted with one or more $R^4$, aryl optionally substituted with one or more $R^4$, and heteroaryl optionally substituted with one or more $R^4$, where each $R^3$ is independently selected from deuterium, halogen, —CN, —$N_3$, —$N(R^5)_2$, and —$OR^5$, each $R^4$ is independently selected from deuterium, halogen, —CN, —$N_3$, $C_1$-$C_6$ alkyl, $C_2$-$C_6$ alkenyl, $C_2$-$C_6$ alkynyl, $C_1$-$C_6$ haloalkyl, —$N(R^5)_2$, and —$OR^5$, wherein each $R^5$ is independently hydrogen, deuterium, or $C_1$-$C_6$ alkyl.

In some embodiments, the compounds of formula (I) as otherwise described herein are those wherein R is selected from hydrogen, deuterium, —CN, $C_1$-$C_{12}$ alkyl optionally substituted with one or more $R^1$, ethenyl (i.e., vinyl), ethynyl, (ethynyl)$C_1$-$C_{10}$ alkyl, $C_3$-$C_{12}$ cycloalkyl optionally substituted with one or more $R^2$, aryl optionally substituted with one or more $R^2$, and heteroaryl optionally substituted with one or more $R^2$. In some embodiments, R is selected from hydrogen, deuterium, —CN, $C_1$-$C_{12}$ alkyl optionally substituted with one or more $R^1$, ethenyl, ethynyl, (ethynyl) $C_1$-$C_{10}$ alkyl, aryl optionally substituted with one or more $R^2$, and heteroaryl optionally substituted with one or more $R^2$.

In some embodiments, R is selected from hydrogen, deuterium, methyl, $C_1$-$C_{12}$ alkyl optionally substituted with one or more $R^1$, aryl optionally substituted with one or more $R^2$, and heteroaryl optionally substituted with one or more $R^2$. In some embodiments, R is selected from hydrogen and deuterium. In one embodiment, R is hydrogen. In one embodiment, R is deuterium.

In some embodiments, R is selected from aryl optionally substituted with one or more $R^2$ and heteroaryl optionally substituted with one or more $R^2$. In some embodiments, R is aryl optionally substituted with one or more $R^2$. In some embodiments, R is aryl. In some embodiments, R is phenyl optionally substituted with one or more $R^2$. In some embodiments, R is phenyl.

In some embodiments, R is heteroaryl optionally substituted with one or more $R^2$. In some embodiments, R is heteroaryl. In some embodiments, R is pyridyl or pyrimidinyl, each optionally substituted with one or more $R^2$. In some embodiments, R is pyridyl or pyrimidinyl.

Another embodiment of the disclosure provides compounds of formula (I) as otherwise described herein wherein R' is selected from hydrogen, deuterium, —CN, $C_1$-$C_{12}$ alkyl optionally substituted with one or more $R^3$, ethenyl (i.e., vinyl), ethynyl, (ethynyl)$C_1$-$C_{10}$ alkyl, $C_3$-$C_{12}$ cycloalkyl optionally substituted with one or more $R^4$, aryl optionally substituted with one or more $R^4$, and heteroaryl optionally substituted with one or more $R^4$. In some embodiments, R' is selected from hydrogen, deuterium, —CN, $C_1$-$C_{12}$ alkyl optionally substituted with one or more $R^3$, ethenyl, ethynyl, (ethynyl)$C_1$-$C_{10}$ alkyl, aryl optionally substituted with one or more $R^4$, and heteroaryl optionally substituted with one or more $R^4$.

In some embodiments, R' is selected from hydrogen, deuterium, methyl, $C_1$-$C_{12}$ alkyl optionally substituted with one or more $R^3$, aryl optionally substituted with one or more $R^4$, and heteroaryl optionally substituted with one or more $R^4$. In some embodiments, R' is selected from hydrogen and deuterium. In one embodiment, R' is hydrogen. In one embodiment, R' is deuterium.

In some embodiments, R' is selected from aryl optionally substituted with one or more $R^4$ and heteroaryl optionally substituted with one or more $R^4$. In some embodiments, R' is aryl optionally substituted with one or more $R^4$. In some embodiments, R' is aryl. In some embodiments, R' is phenyl optionally substituted with one or more $R^4$. In some embodiments, R' is phenyl.

In some embodiments, R' is heteroaryl optionally substituted with one or more $R^4$. In some embodiments, R' is heteroaryl. In some embodiments, R' is pyridyl or pyrimidinyl, each optionally substituted with one or more $R^4$. In some embodiments, R' is pyridyl or pyrimidinyl.

In certain embodiments of the disclosure, the compounds of formula (I) as otherwise described herein are those wherein each $R^1$ is independently selected from deuterium, —CN, —$N_3$, —$N(R^5)_2$, and —$OR^5$. In some embodiments, each $R^1$ is independently selected from deuterium, —CN, and —$N_3$. In some embodiments, each $R^1$ is independently selected from deuterium, —$N(R^5)_2$, and —$OR^5$. In some embodiments, each $R^1$ is independently deuterium.

In certain embodiments of the disclosure, the compounds of formula (I) as otherwise described herein are those wherein each $R^2$ is independently selected from deuterium, —CN, —$N_3$, $C_1$-$C_6$ alkyl, $C_2$-$C_6$ alkenyl, $C_2$-$C_6$ alkynyl, —$N(R^5)_2$, and —$OR^5$. In some embodiments, each $R^2$ is independently selected from deuterium, —CN, —$N_3$, $C_1$-$C_6$ alkyl, ethenyl, ethynyl, —$N(R^5)_2$, and —$OR^5$. In some embodiments, each $R^2$ is independently selected from deuterium, —CN, —$N_3$, methyl, ethenyl, ethynyl, —$N(R^5)_2$, and —$OR^5$. In some embodiments, each $R^2$ is independently selected from deuterium, —CN, —$N_3$, $C_1$-$C_6$ alkyl, ethenyl, and ethynyl. In some embodiments, each $R^2$ is independently selected from deuterium, $C_1$-$C_6$ alkyl, ethenyl, and ethynyl. In some embodiments, each $R^2$ is independently selected from deuterium, —CN, and —$N_3$. In some embodiments, each $R^2$ is independently selected from deuterium, —$N(R^5)_2$, and —$OR^5$. In some embodiments, each $R^2$ is independently deuterium.

In certain embodiments of the disclosure, the compounds of formula (I) as otherwise described herein are those wherein each $R^3$ is independently selected from deuterium, —CN, —$N_3$, —$N(R^5)_2$, and —$OR^5$. In some embodiments, each $R^3$ is independently selected from deuterium, —CN, and —$N_3$. In some embodiments, each $R^3$ is independently selected from deuterium, —$N(R^5)_2$, and —$OR^5$. In some embodiments, each $R^3$ is independently deuterium.

In certain embodiments of the disclosure, the compounds of formula (I) as otherwise described herein are those wherein each $R^4$ is independently selected from deuterium, —CN, —$N_3$, $C_1$-$C_6$ alkyl, $C_2$-$C_6$ alkenyl, $C_2$-$C_6$ alkynyl, —$N(R^5)_2$, and —$OR^5$. In some embodiments, each $R^4$ is independently selected from deuterium, —CN, —$N_3$, $C_1$-$C_6$ alkyl, ethenyl, ethynyl, —$N(R^5)_2$, and —$OR^5$. In some embodiments, each $R^4$ is independently selected from deuterium, —CN, —$N_3$, methyl, ethenyl, ethynyl, —$N(R^5)_2$, and —$OR^5$. In some embodiments, each $R^4$ is independently selected from deuterium, —CN, —$N_3$, $C_1$-$C_6$ alkyl, ethenyl, and ethynyl. In some embodiments, each $R^4$ is independently selected from deuterium, $C_1$-$C_6$ alkyl, ethenyl, and ethynyl. In some embodiments, each $R^4$ is independently selected from deuterium, —CN, and —$N_3$. In some embodiments, each $R^4$ is independently selected from deuterium, —$N(R^5)_2$, and —$OR^5$. In some embodiments, each $R^4$ is independently deuterium.

In certain exemplary embodiments, the $^{15}$N-1,2,4,5-tetrazine of the disclosure is: 3-phenyl-1,2,4,5-tetrazine-1,2,4,5-$^{15}N_4$ or 3-phenyl-1,2,4,5-tetrazine-6-d-1,2,4,5-$^{15}N_4$.

The methods of the disclosure include a target molecule having a bioorthogonal reactive moiety. Particularly useful bioorthogonal reactive moieties are strained azadienophiles capable of reacting with the 1,2,3,4-tetrazine via an inverse-demand Diels-Alder reaction (IEDDA). In certain embodiments of the disclosure, the bioorthogonal reactive moiety in the target molecule as otherwise described herein is transcyclooctene, cyclooctyne, or norbornene moiety.

Some examples of bioorthogonal reactive moieties useful in the methods of the disclosure include those provided in Oliveira et al. ("Inverse electron demand Diels-Alder reactions in chemical biology," Chem. Soc. Rev. 2017, 46 (16), 4895-4950), Row et al. ("Constructing New Bioorthogonal Reagents and Reactions," Acc. Chem. Res. 2018, 51 (5), 1073-1081), and Wu et al. ("Advances in Tetrazine Bioorthogonal Chemistry Driven by the Synthesis of Novel Tetrazines and Dienophiles," Acc. Chem. Res. 2018, 51 (5), 1249-1259), which are incorporated herein in their entirety.

In certain embodiments, the bioorthogonal reactive moiety on the target molecule is:

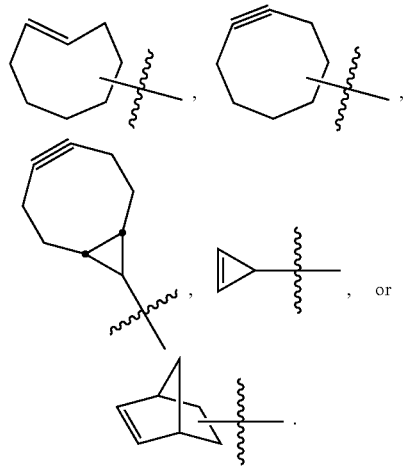

The target molecule of the disclosure may include any molecule that is capable of binding or interacting with another molecule of interest. For example, the target molecule may be a member of a binding pair, such as a receptor or a ligand; or an antibody or an antigen. In some embodiments, the target molecule is capable of binding with biomolecules, such as proteins, nucleic acids, carbohydrates, glycan, lipids, cell membranes, as well as small molecules such as primary metabolites, secondary metabolites, and natural products.

The present disclosure provides, in part, compositions as molecular tags for hyperpolarization NMR and magnetic resonance and methods of making and using same. Thus, the disclosure also provides a hyperpolarized $^{15}$N-1,2,4,5-tetrazine of formula (I) as described herein and an acceptable medium.

Another aspect of the disclosure provides sensors or sensing molecules suitable for use in magnetic resonance imaging. For example, one aspect of the disclosure provides sensors that comprise, consist of, or consist essentially of: a hyperpolarized target molecule prepared by methods of the disclosure as provided herein. For example, in certain embodiments, the hyperpolarized target molecule comprises the following group:

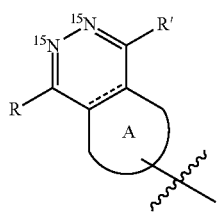

where R and R' are as described with respect to formula (I), and ring A is a reaction product of the coupling reaction of the bioorthogonal reactive moiety.

In certain embodiments, the hyperpolarized target molecule comprises the following group:

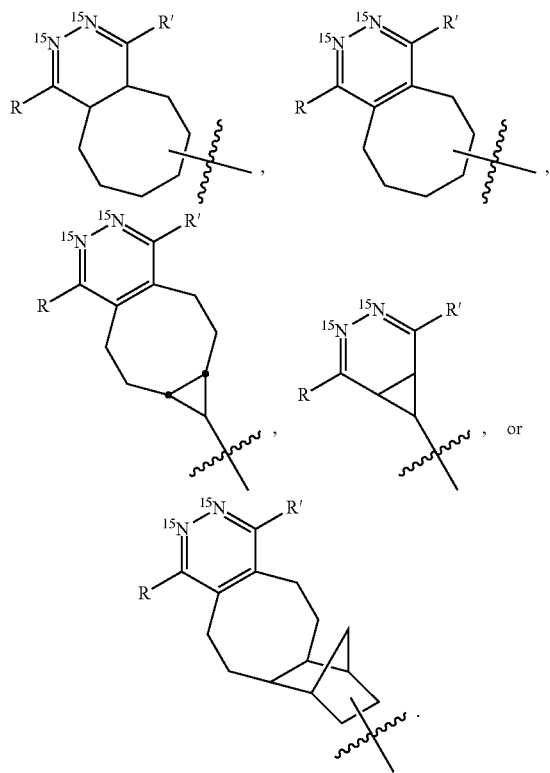

As provided above, the methods of the disclosure also provide hyperpolarized $^5N_2$ gas. For example, the methods of the disclosure allow for selective preparation of para-$^{15}N_2$ and ortho-$^{15}N_2$ spin isomer. Because para-$^{15}N_2$ gas is a biologically and medically innocuous gas with mathematical properties similar to para-$H_2$, hyperpolarized para-$^{15}N_2$ gas provides a great potential for HP-MRI. For example, the hyperpolarized $^5N_2$ gas of the disclosure may be used in pulmonary imaging, such as the lungs of subjects with chronic obstructive pulmonary disease (COPD) as well as other pulmonary diseases. Thus, in one aspect, the disclosure provides sensors comprising hyperpolarized $^{15}N_2$ gas prepared by methods of the disclosure as provided herein. Such sensors may be used in the methods of pulmonary imaging, for example, by administering the hyperpolarized $^{15}N_2$ gas prepared by methods of the disclosure as provided herein to the lungs, and detecting hyperpolarized $^{15}N$ atoms by $^{15}N$-magnetic resonance to image the lungs.

In general, the hyperpolarized target molecule and/or hyperpolarized $^{15}N_2$ gas of the disclosure may be used in the methods of in vitro or in vivo sensing (or imaging). Such methods comprise, consist of, or consist essentially of:

providing (1) a target molecule comprising a bioorthogonal reactive moiety and (2) a bioorthogonal tag comprising hyperpolarized $^{15}N$ atoms to a sample or a subject, under conditions suitable for the bioorthogonal reactive moiety to undergo a coupling reaction with the biorthogonal tag to produce hyperpolarized target molecule and hyperpolarized $^{15}N_2$ gas;

allowing for at least a portion of the hyperpolarized target molecule and/or hyperpolarized $^{15}N_2$ gas to be modulated in the sample or the subject; and detecting hyperpolarized $^{15}N$ atoms by $^{15}N$-magnetic resonance to determine modulation.

For example, the hyperpolarized target molecule may bind (or interact) with another molecule of interest to allow for sensing (or imaging) of the molecule of interest. For example, the target molecule may be a member of a binding pair, such as a receptor or a ligand; or an antibody or an antigen, capable of binding with biomolecules, such as proteins, nucleic acids, carbohydrates, glycan, lipids, cell membranes, as well as small molecules such as primary metabolites, secondary metabolites, and natural products. As a result, the method would allow for in vitro or in vivo sensing (or imaging) of such biomolecules. This method would also allow for labeling a biomolecule with a hyperpolarized moiety.

Oliveira et al. (*Chem. Soc. Rev.* 2017, 46 (16), 4895-4950), Row et al. (*Acc. Chem. Res.* 2018, 51 (5), 1073-1081), and Wu et al. (*Acc. Chem. Res.* 2018, 51 (5), 1249-1259), which are incorporated herein in their entirety, provide several examples of platforms and molecules of interest and in which the present methods may be utilized.

In another example, the hyperpolarized $^{15}N_2$ gas may bind (or interact) with another molecule of interest to allow for sensing (or imaging) of the molecule of interest. For example, the hyperpolarized $^{15}N_2$ gas may complex with a metal-containing target ligand, (such as transition metal catalysts and biocatalysts). In some embodiments, the hyperpolarized $^{15}N_2$ gas may complex with a transition metal (e.g., Rh, Co, Mo) molecule.

Definitions

Articles "a" and "an" are used herein to refer to one or to more than one (i.e. at least one) of the grammatical object of the article. By way of example, "an element" means at least one element and can include more than one element.

"About" is used to provide flexibility to a numerical range endpoint by providing that a given value may be "slightly above" or "slightly below" the endpoint without affecting the desired result.

The use herein of the terms "including," "comprising," or "having," and variations thereof, is meant to encompass the elements listed thereafter and equivalents thereof as well as additional elements. Embodiments recited as "including," "comprising," or "having" certain elements are also contemplated as "consisting essentially of and "consisting of those certain elements.

Recitation of ranges of values herein are merely intended to serve as a shorthand method of referring individually to each separate value falling within the range, unless otherwise-Indicated herein, and each separate value is incorporated into the specification as if it were individually recited herein. For example, if a concentration range is stated as 1% to 50%, it is intended that values such as 2% to 40%, 10% to 30%, or 1% to 3%, etc., are expressly enumerated in this specification. These are only examples of what is specifically intended, and all possible combinations of numerical values between and including the lowest value and the highest value enumerated are to be considered to be expressly stated in this disclosure.

The term "effective amount" or "therapeutically effective amount" refers to an amount sufficient to effect beneficial or desirable biological and/or clinical results.

As used herein, the term "hyperpolarize" and "hyperpolarized" mean to artificially enhance the polarization of nuclei (such as nuclei of $^{15}N$ atoms) over the natural or equilibrium levels. For example, in certain embodiments, the hyperpolarized compounds of the disclosure show signal gains in the range of, for example, 100-fold to 30,000-fold, or even more than 30,000-fold. Such an increase is desirable because it allows stronger imaging signals by dramatically increasing signal to noise in magnetic resonance.

As used herein, the term "subject" refers to both human and nonhuman animals. The term "nonhuman animals" of the disclosure includes all vertebrates, e.g., mammals and non-mammals, such as nonhuman primates, sheep, dog, cat, horse, cow, chickens, amphibians, reptiles, and the like.

Unless otherwise defined, all technical terms used herein have the same meaning as commonly understood by one of ordinary skill in the art to which this disclosure belongs.

Terms used herein may be preceded and/or followed by a single dash, "-", or a double dash, "=", to indicate the bond order of the bond between the named substituent and its parent moiety; a single dash indicates a single bond and a double dash indicates a double bond. In the absence of a single or double dash it is understood that a single bond is formed between the substituent and its parent moiety; further, substituents are intended to be read "left to right" (i.e., the attachment is via the last portion of the name) unless a dash indicates otherwise. For example, $C_1$-$C_6$alkoxycarbonyloxy and —OC(O)$C_1$-$C_6$alkyl indicate the same functionality; similarly arylalkyl and -alkylaryl indicate the same functionality.

The term "alkenyl" as used herein, means a straight or branched chain hydrocarbon containing from 2 to 10 carbons, unless otherwise specified, and containing at least one carbon-carbon double bond. Representative examples of alkenyl include, but are not limited to, ethenyl, 2-propenyl, 2-methyl-2-propenyl, 3-butenyl, 4-pentenyl, 5-hexenyl, 2-heptenyl, 2-methyl-1-heptenyl, 3-decenyl, and 3,7-dimethylocta-2,6-dienyl.

The term "alkyl" as used herein, means a straight or branched chain hydrocarbon containing from 1 to 10 carbon atoms unless otherwise specified. Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, and n-decyl. When an "alkyl" group is a linking group between two other moieties, then it may also be a straight or branched chain; examples include, but are not limited to —CH$_2$—, —CH$_2$CH$_2$—, —CH$_2$CH$_2$CHC(CH$_3$)—, and —CH$_2$CH(CH$_2$CH$_3$)CH$_2$—.

The term "alkynyl" as used herein, means a straight or branched chain hydrocarbon group containing from 2 to 10 carbon atoms and containing at least one carbon-carbon triple bond. Representative examples of alkynyl include, but are not limited, to acetylenyl, 1-propynyl, 2-propynyl, 3-butynyl, 2-pentynyl, and 1-butynyl.

The term "aryl," as used herein, means a phenyl (i.e., monocyclic aryl), or a bicyclic ring system containing at least one phenyl ring or an aromatic bicyclic ring containing only carbon atoms in the aromatic bicyclic ring system. The bicyclic aryl can be azulenyl, naphthyl, or a phenyl fused to a monocyclic cycloalkyl, a monocyclic cycloalkenyl, or a monocyclic heterocyclyl. The bicyclic aryl is attached to the parent molecular moiety through any carbon atom contained within the phenyl portion of the bicyclic system, or any carbon atom with the napthyl or azulenyl ring. The fused monocyclic cycloalkyl or monocyclic heterocyclyl portions of the bicyclic aryl are optionally substituted with one or two oxo and/or thioxo groups. Representative examples of the bicyclic aryls include, but are not limited to, azulenyl, naphthyl, dihydroinden-1-yl, dihydroinden-2-yl, dihydroinden-3-yl, dihydroinden-4-yl, 2,3-dihydroindol-4-yl, 2,3-dihydroindol-5-yl, 2,3-dihydroindol-6-yl, 2,3-dihydroindol-7-yl, inden-1-yl, inden-2-yl, inden-3-yl, inden-4-yl, dihydronaphthalen-2-yl, dihydronaphthalen-3-yl, dihydronaphthalen-4-yl, dihydronaphthalen-1-yl, 5,6,7,8-tetrahydronaphthalen-1-yl, 5,6,7,8-tetrahydronaphthalen-2-yl, 2,3-dihydrobenzofuran-4-yl, 2,3-dihydrobenzofuran-5-yl, 2,3-dihydrobenzofuran-6-yl, 2,3-dihydrobenzofuran-7-yl, benzo[d][1,3]dioxol-4-yl, benzo[d][1,3]dioxol-5-yl, 2H-chromen-2-on-5-yl, 2H-chromen-2-on-6-yl, 2H-chromen-2-on-7-yl, 2H-chromen-2-on-8-yl, isoindoline-1,3-dion-4-yl, isoindoline-1,3-dion-5-yl, inden-1-on-4-yl, inden-1-on-5-yl, inden-1-on-6-yl, inden-1-on-7-yl, 2,3-dihydrobenzo[b][1,4]dioxan-5-yl, 2,3-dihydrobenzo[b][1,4]dioxan-6-yl, 2H-benzo[b][1,4]oxazin3(4H)-on-5-yl, 2H-benzo[b][1,4]oxazin3(4H)-on-6-yl, 2H-benzo[b][1,4]oxazin3(4H)-on-7-yl, 2H-benzo[b][1,4]oxazin3(4H)-on-8-yl, benzo[d]oxazin-2(3H)-on-5-yl, benzo[d]oxazin-2(3H)-on-6-yl, benzo[d]oxazin-2(3H)-on-7-yl, benzo[d]oxazin-2(3H)-on-8-yl, quinazolin-4(3H)-on-5-yl, quinazolin-4(3H)-on-6-yl, quinazolin-4(3H)-on-7-yl, quinazolin-4(3H)-on-8-yl, quinoxalin-2(1H)-on-5-yl, quinoxalin-2(1H)-on-6-yl, quinoxalin-2(1H)-on-7-yl, quinoxalin-2(1H)-on-8-yl, benzo[d]thiazol-2(3H)-on-4-yl, benzo[d]thiazol-2(3H)-on-5-yl, benzo[d]thiazol-2(3H)-on-6-yl, and, benzo[d]thiazol-2(3H)-on-7-yl. In certain embodiments, the bicyclic aryl is (i) naphthyl or (ii) a phenyl ring fused to either a 5 or 6 membered monocyclic cycloalkyl, a 5 or 6 membered monocyclic cycloalkenyl, or a 5 or 6 membered monocyclic heterocyclyl, wherein the fused cycloalkyl, cycloalkenyl, and heterocyclyl groups are optionally substituted with one or two groups which are independently oxo or thioxo.

The term "cycloalkyl" as used herein, means a monocyclic or a bicyclic cycloalkyl ring system. Monocyclic ring systems are cyclic hydrocarbon groups containing from 3 to 8 carbon atoms, where such groups can be saturated or unsaturated, but not aromatic. In certain embodiments, cycloalkyl groups are fully saturated. Examples of monocyclic cycloalkyls include cyclopropyl, cyclobutyl, cyclopentyl, cyclopentenyl, cyclohexyl, cyclohexenyl, cycloheptyl, and cyclooctyl. Bicyclic cycloalkyl ring systems are bridged monocyclic rings or fused bicyclic rings. Bridged monocyclic rings contain a monocyclic cycloalkyl ring where two non-adjacent carbon atoms of the monocyclic ring are linked by an alkylene bridge of between one and three additional carbon atoms (i.e., a bridging group of the form —(CH$_2$)$_w$—, where w is 1, 2, or 3). Representative examples of bicyclic ring systems include, but are not limited to, bicyclo[3.1.1]heptane, bicyclo[2.2.1]heptane, bicyclo[2.2.2]octane, bicyclo[3.2.2]nonane, bicyclo[3.3.1]nonane, and bicyclo[4.2.1]nonane. Fused bicyclic cycloalkyl ring systems contain a monocyclic cycloalkyl ring fused to either a phenyl, a monocyclic cycloalkyl, a monocyclic cycloalkenyl, a monocyclic heterocyclyl, or a monocyclic heteroaryl. The bridged or fused bicyclic cycloalkyl is attached to the parent molecular moiety through any carbon atom contained within the monocyclic cycloalkyl ring. Cycloalkyl groups are optionally substituted with one or two groups which are independently oxo or thioxo. In certain embodiments, the fused bicyclic cycloalkyl is a 5 or 6 membered monocyclic cycloalkyl ring fused to either a phenyl ring, a 5 or 6 membered monocyclic cycloalkyl, a 5 or 6 membered monocyclic cycloalkenyl, a 5 or 6 membered monocyclic heterocyclyl, or a 5 or 6 membered monocyclic heteroaryl, wherein the fused bicyclic cycloalkyl is optionally substituted by one or two groups which are independently oxo or thioxo.

The term "halo" or "halogen" as used herein, means —Cl, —Br, —I or —F.

The term "haloalkyl" refers to an alkyl group, which is substituted with one or more halogen atoms.

The term "heteroaryl," as used herein, means a monocyclic heteroaryl or a bicyclic ring system containing at least one heteroaromatic ring. The monocyclic heteroaryl can be a 5 or 6 membered ring. The 5 membered ring consists of two double bonds and one, two, three or four nitrogen atoms and optionally one oxygen or sulfur atom. The 6 membered ring consists of three double bonds and one, two, three or four nitrogen atoms. The 5 or 6 membered heteroaryl is connected to the parent molecular moiety through any carbon atom or any nitrogen atom contained within the heteroaryl. Representative examples of monocyclic heteroaryl include, but are not limited to, furyl, imidazolyl, isoxazolyl, isothiazolyl, oxadiazolyl, oxazolyl, pyridinyl, pyridazinyl, pyrimidinyl, pyrazinyl, pyrazolyl, pyrrolyl, tetrazolyl, thiadiazolyl, thiazolyl, thienyl, triazolyl, and triazinyl. The bicyclic heteroaryl consists of a monocyclic heteroaryl fused to a phenyl, a monocyclic cycloalkyl, a monocyclic cycloalkenyl, a monocyclic heterocyclyl, or a monocyclic heteroaryl. The fused cycloalkyl or heterocyclyl portion of the bicyclic heteroaryl group is optionally substituted with one or two groups which are independently oxo or thioxo. When the bicyclic heteroaryl contains a fused cycloalkyl, cycloalkenyl, or heterocyclyl ring, then the bicyclic heteroaryl group is connected to the parent molecular moiety through any carbon or nitrogen atom contained within the monocyclic heteroaryl portion of the bicyclic ring system. When the bicyclic heteroaryl is a monocyclic heteroaryl fused to a benzo ring, then the bicyclic heteroaryl group is connected to the parent molecular moiety through any carbon atom or nitrogen atom within the bicyclic ring system. Representative examples of bicyclic heteroaryl include, but are not limited to, benzimidazolyl, benzofuranyl, benzothienyl, benzoxadiazolyl, benzoxathiadiazolyl, benzothiazolyl, cinnolinyl, 5,6-dihydroquinolin-2-yl, 5,6-dihydroisoquinolin-1-yl, furopyridinyl, indazolyl, indolyl, isoquinolinyl, naphthyridinyl, quinolinyl, purinyl, 5,6,7,8-tetrahydroquinolin-2-yl, 5,6,7,8-tetrahydroquinolin-3-yl, 5,6,7,8-tetrahydroquinolin-4-yl, 5,6,7,8-tetrahydroisoquinolin-1-yl, thienopyridinyl, 4,5,6,7-tetrahydrobenzo[c][1,2,5]oxadiazolyl, 2,3-dihydrothieno[3,4-b][1,4]dioxan-5-yl, and 6,7-dihydrobenzo[c][1,2,5]oxadiazol-4(5H)-onyl. In certain embodiments, the fused bicyclic heteroaryl is a 5 or 6 membered monocyclic heteroaryl ring fused to either a phenyl ring, a 5 or 6 membered monocyclic cycloalkyl, a 5 or 6 membered monocyclic cycloalkenyl, a 5 or 6 membered monocyclic heterocyclyl, or a 5 or 6 membered monocyclic heteroaryl, wherein the fused cycloalkyl, cycloalkenyl, and heterocyclyl groups are optionally substituted with one or two groups which are independently oxo or thioxo.

The term "oxo" as used herein means a =O group.

The term "substituted", as used herein, means that a hydrogen radical of the designated moiety is replaced with the radical of a specified substituent, provided that the substitution results in a stable or chemically feasible compound. The term "substitutable", when used in reference to a designated atom, means that attached to the atom is a hydrogen radical, which can be replaced with the radical of a suitable substituent.

The phrase "one or more" substituents, as used herein, refers to a number of substituents that equals from one to the maximum number of substituents possible based on the number of available bonding sites, provided that the above conditions of stability and chemical feasibility are met. Unless otherwise indicated, an optionally substituted group may have a substituent at each substitutable position of the group, and the substituents may be either the same or different. As used herein, the term "independently selected" means that the same or different values may be selected for multiple 19-481-us instances of a given variable in a single compound.

The term "thioxo" as used herein means a =S group.

EXAMPLES

The methods of the disclosure is illustrated further by the following examples, which are not to be construed as limiting the disclosure in scope or spirit to the specific procedures and materials described in them.

General Procedures:

All commercially available reagents and solvents were used as received (unless otherwise stated). Thin-layer chromatography (TLC) was performed using aluminum plates pre-coated with 0.25 mm of 230-400 mesh silica gel with a fluorescent indicator (254 nm). TLC plates were visualized by exposure to ultraviolet light and/or exposure to a solution of KMnO4 and/or vanillin stain. Organic solutions were concentrated in vacuo using a rotary evaporator. Column chromatography was performed with silica gel (60 Å, standard grade).

Nuclear magnetic resonance spectra were recorded at ambient temperature (unless otherwise stated) on Bruker AM-360 MHz, Varian iNova 400 MHz, or Varian iNova 500 MHz spectrometers. NMR data are represented as follows: chemical shift, multiplicity, coupling constant, and integration. All values for proton chemical shifts (δH) are reported in parts per million and are referenced to the residual internal CHD$_2$OD (δ 3.31). All values for carbon chemical shifts (δC) are reported in parts per million and are referenced to the carbon resonances in CDCl$_3$ (δ 77.0) or CD$_3$OD (δ 49.0). All values for nitrogen chemical shifts (δN) are reported in parts per million and are referenced to an external standard of liquid NH$_3$ (δ 0.0); the reference point is calculated from the ratios of resonance frequencies following IUPAC recommendations. Resonances are described as s (singlet), d (doublet), t (triplet), q (quartet), quint (quintet), and combinations thereof. Coupling constants (J) are given in Hz and rounded to the nearest 0.1.

High resolution mass spectra were recorded using either (1) an Agilent 6224 TOF LC/MS instrument (denoted by LC/ESI) or (2) an Agilent 7890B GC and 7200 QTOF instrument (denoted by GC/EI). High resolution m/z values are reported in Daltons, calculated to 4 decimal points from the molecular formula. All found values are within 5 ppm tolerance.

Infrared spectra were recorded on a ThermoScientific Nicolet 6700 FTIR equipped with a diamond ATR. Absorption maxima (vmax) are described as s (strong), m (medium), w (weak), and br (broad) and are quoted in wavenumbers (cm-1). Only selected peaks are reported.

Example 1: Synthesis of 1,2,4,5-Tetrazines

This example demonstrates that $^{15}$N-labeled 3-phenyl-1,2,4,5-tetrazines, such as 3-phenyl-(6-H)—$^{15}$N$_4$-1,2,4,5-tetrazine 1a and 3-phenyl-(6-D)-$^{15}$N$_4$-1,2,4,5-tetrazine 1b, can be used as a dual tag for hyperpolarization and bioorthogonal reactions. These tetrazines can be synthesized from ortho-ester precursors with $^{15}$N$_2$-hydrazine hydrate, as described below.

For typical hyperpolarization experiments, a solution of $^{15}$N-enriched tetrazine (1a or 1b, 1.5 mM), pyridine (1.0 mM), and Ir(IMes)(COD) Cl (0.15 mM) in methanol-d$_4$ (400 μL) was prepared. (IMes=1,3-bis(2,4,6-trimethylphenyl)imidazol-2-ylidene; COD=1,5-cyclooctadiene.)

3-Phenyl-1,2,4,5-tetrazine-1,2,4,5-$^{15}$N$_4$ (1a).

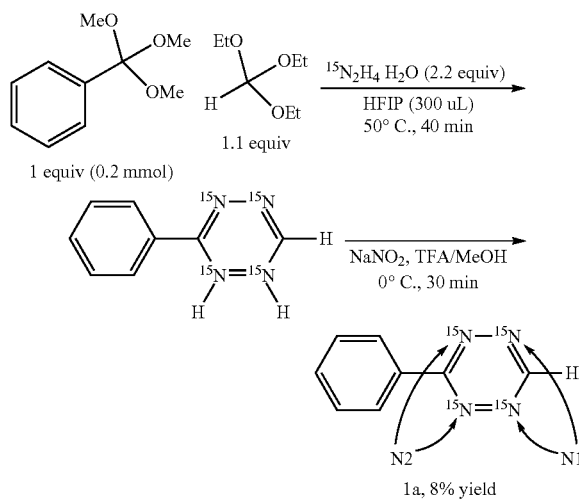

To a 1-dram vial was added sequentially: trimethyl orthobenzoate (36.4 mg, 0.2 mmol, 1 equivalent), hexafluoroisopropanol (300 μL), triethyl orthoformate (31.1 mg, 0.21 mmol, 1.05 equivalents), and $^{15}$N$_2$-hydrazine hydrate (22.38 mg, 0.43 mmol, 2.15 equivalents). The reaction mixture was stirred at 50° C. for 40 min, then cooled to 0° C., followed by the addition of MeOH (300 μL) and NaNO$_2$ (41.4 mg, 0.6 mmol, 3.0 equivalents). To this mixture, was added dropwise trifluoroacetic acid (300 μL) at 0° C., resulting in generation of a deep red color. The reaction mixture was stirred at 0° C. for 30 min, and then was diluted with water (5 mL). The mixture was extracted with CHCl$_3$ (5 mL×3). The organic layers were combined and concentrated in vacuo. Purification by column chromatography (pentane to 5% ethyl acetate-pentane) gave 1a as a pink solid (2.5 mg, 8%). Rf=0.82 (5% ethyl acetate-pentane); $^1$H NMR (360 MHz, CD$_3$OD): δ 10.34 (tt, JH—N1=14.0, JH—N2=2.4 Hz, 1H), 8.60-8.58 (m, 2H), 7.71-7.62 (m, 3H); $^{13}$C NMR (126 MHz, CDCl$_3$): δ 166.5-166.3 (m, 1C), 157.8-157.7 (m, 1C), 133.1, 131.6-131.5 (m, 1C), 129.3, 128.3; $^{15}$N NMR (36.5 MHz, CD$_3$OD): δ 389.4-388.3 (m, N1), 381.2-380.4 (m, N2); FTIR (thin film, CH$_2$Cl$_2$): 3359 (br), 2917, 1653 (br), 1407, 1260, 1015, 795 cm-1; HRMS-GC/EI (m/z) Calc'd for (C$_8$H$_6$$^{15}$N$_4$$^+$) ([M]$^+$): 162.0468; found: 162.0473.

3-Phenyl-1,2,4,5-tetrazine-6-d-1,2,4,5-$^{15}$N$_4$ (1b).

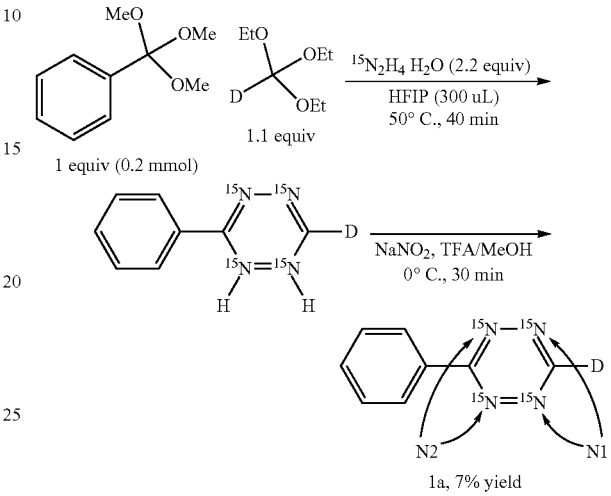

Following the same procedure for 1a, substituting triethyl orthoformate-1-d (45) for triethyl orthoformate, 1b was isolated as a pink solid (2.3 mg, 7%). Rf=0.82 (5% ethyl acetate-pentane); $^1$H NMR (360 MHz, CD$_3$OD): δ 8.60-8.57 (m, 2H), 7.71-7.61 (m, 3H); $^{13}$O NMR (126 MHz, CDCl$_3$): δ 166.5, 157.9-157.2 (m, Csp2-D), 133.1, 131.6, 129.4, 128.3; $^{15}$N NMR (36.5 MHz, CD$_3$OD): δ 389.0-388.2 (m, N1), 381.2-380.3 (m, N2); FTIR (thin film, CH$_2$Cl$_2$): 3356 (br), 2918, 1636 (br), 1407, 1264, 1113, 736 cm-1; HRMS-GC/EI (m/z) Calc'd for (C$_8$H$_5$D$^{15}$N$_4$+) ([M]+): 163.0531; found: 163.0535.

3-Phenyl-1,2,4,5-tetrazine (1c).

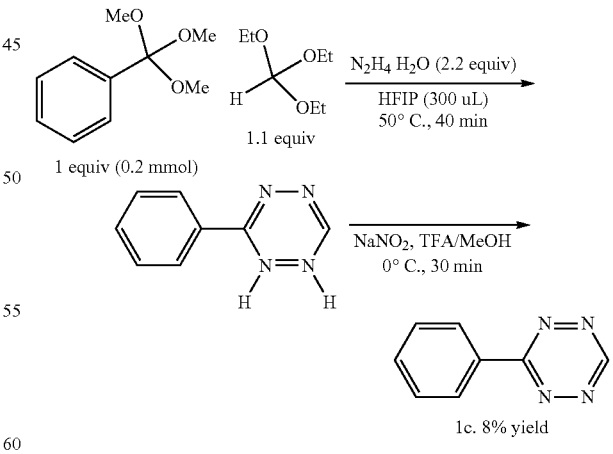

Following the same procedure for 1a, substituting natural abundance-hydrazine hydrate for 15N2-hydrazine hydrate, 1c was isolated as a pink solid (2.4 mg, 8%). Rf=0.82 (5% ethyl acetate-pentane); $^1$H NMR (500 MHz, CD$_3$OD): δ 10.34 (s, 1H), 8.64-8.59 (m, 2H), 7.70-7.62 (m, 3H); $^{13}$C NMR (126 MHz, CDCl$_3$): δ 166.3, 157.7, 133.0, 131.5, 129.2, 128.1; FTIR (thin film, $CH_2Cl_2$): 3085, 2924, 1438, 1351, 914, 761, 689, 566 cm-1; HRMS-GC/EI (m/z) Calc'd for ($C_8H_6N_4+$) ([M]+): 158.0587; found: 158.0593.

Example 2: Cycloaddition Reactions of 1,2,4,5-Tetrazine/Cyclooctyne (1-Phenyl-6,6a,7,7a,8,9-hexahydro-5H-cyclopropa[5,6]cycloocta[1,2-d]pyridazin-7-yl-2,3-$^{15}N_2$)methanol (3a).

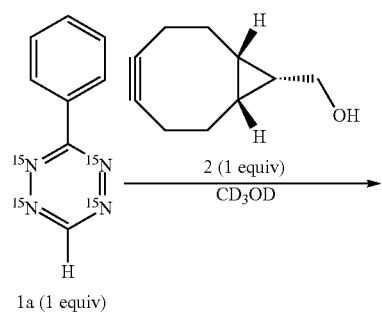

To an NMR tube, was added a solution of 1a (1.6 mg, 0.01 mmol, 1 equivalent) in $CD_3OD$ (200 µL), followed by a solution of (1R,8S,9s)-bicyclo[6.1.0]non-4-yn-9-ylmethanol 2 (1.5 mg, 0.01 mmol, 1 equivalent) in $CD_3OD$ (200 µL). The reaction was swirled for 15 seconds. Immediately upon addition, the color of the solution changed from pink (due to the pink color of the tetrazine 1a) to colorless. NMR characterization spectra were obtained directly from this sample. The mixture was transferred to a vial and concentrated in vacuo to give 3a as yellow oil (2.7 mg, 96%). Note that product appears to degrade on silica gel. $^1$H NMR (360 MHz, $CD_3OD$): δ 8.93-8.89 (dd, JH—N1=10.4, JH—N2=4.5 Hz, 1H), 7.55-7.53 (m, 3H), 7.48-7.45 (m, 2H), 3.71-3.61 (m, 2H), 3.19-3.11 (dt, J=15.0, 5.9 Hz, 1H), 2.99-2.92 (m, 2H), 2.76-2.69 (dt, J=14.4, 5.6 Hz, 1H), 2.38-2.29 (m, 1H), 2.13-2.05 (m, 1H), 1.74-1.58 (m, 2H), 1.15-1.06 (quint, J=8.1 Hz, 1H), 1.02-0.88 (m, 2H); $^{15}$N NMR (36.5 MHz, $CD_3OD$): δ 372.8-371.2 (m, N1 and N2); HRMS-LC/ESI (m/z) Calc'd for ($C_{18}H_{21}{}^{15}N_2O$) ([M+H]+): 283.1589; found: 283.1597.

(1-Phenyl-6,6a,7,7a,8,9-hexahydro-5H-cyclopropa[5,6]cycloocta[1,2-d]pyridazin-7-yl-4-d-2,3-$^{15}N_2$)methanol (3b).

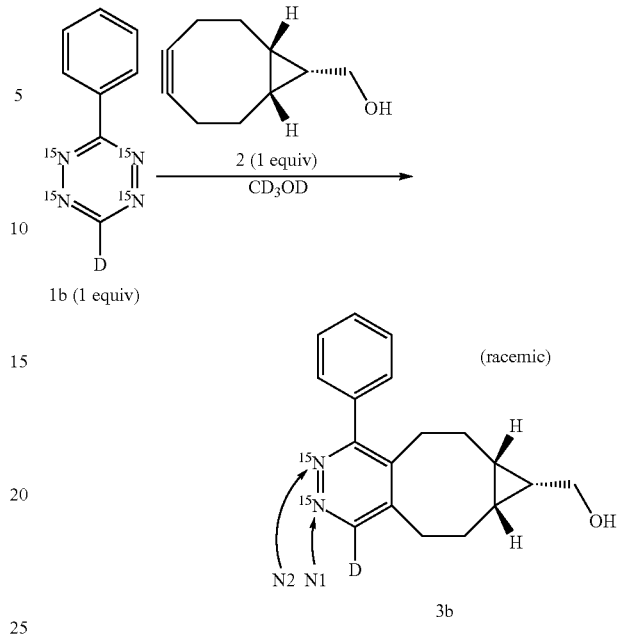

Following the same procedure for 3a, substituting 1b for 1a, 3b was isolated as a yellow oil (2.8 mg, 100%). $^1$H NMR (360 MHz, $CD_3OD$): δ 7.54-7.53 (m, 3H), 7.47-7.45 (m, 2H), 3.71-3.61 (m, 2H), 3.19-3.11 (dt, J=14.8, 5.9 Hz, 1H), 3.00-2.92 (m, 2H), 2.76-2.69 (dt, J=14.0, 5.6 Hz, 1H), 2.38-2.30 (m, 1H), 2.13-2.04 (m, 1H), 1.74-1.58 (m, 2H), 1.15-1.06 (quint, J=8.0 Hz, 1H), 1.03-0.87 (m, 2H); $^{15}$N NMR (36.5 MHz, $CD_3OD$): δ 372.6-371.3 (m, N1 and N2); HRMS-LC/ESI (m/z) Calc'd for ($C_{18}H_{20}D_{15}N_2O^+$) ([M+H]+): 284.1652; found: 284.1657.

(1-Phenyl-6,6a,7,7a,8,9-hexahydro-5H-cyclopropa[5,6]cycloocta[1,2-d]pyridazin-7-yl)methanol (3c).

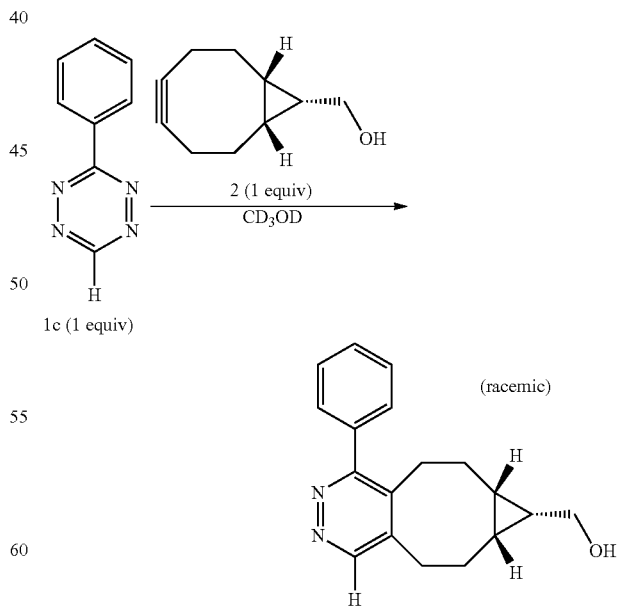

To a 1-dram vial, was added a solution of 1c (7.9 mg, 0.05 mmol, 1 equivalent) in $CD_3OD$ (3.33 mL) and a solution of 2 (7.5 mg, 0.05 mmol, 1 equivalent) in CD$_3$OD (1.67 mL). Immediately upon addition, the color of the solution changed from pink (due to the pink color of the tetrazine 1c) to colorless. After 15 seconds of shaking, the reaction mixture was concentrated in vacuo to give 3c as a yellow oil (13.8 mg, 98%). Note that product appears to degrade on silica gel. $^1$H NMR (500 MHz, CD$_3$OD): δ 8.92 (s, 1H), 7.54-7.53 (m, 3H), 7.47-7.45 (m, 2H), 3.70-3.62 (m, 2H), 3.17-3.12 (dt, J=14.3, 6.4 Hz, 1H), 2.98-2.92 (m, 2H), 2.75-2.70 (dt, J=14.0, 5.5 Hz, 1H), 2.36-2.30 (m, 1H), 2.11-2.04 (m, 1H), 1.72-1.59 (m, 2H), 1.13-1.07 (quint, J=8.2 Hz, 1H), 1.01-0.90 (m, 2H); $^{13}$C NMR (125 MHz, CD$_3$OD): δ 163.6, 153.1, 145.3, 142.9, 138.5, 130.1, 129.5, 59.3, 31.4, 28.5, 24.7, 22.9, 20.4, 19.9; FTIR (thin film, CH$_2$Cl$_2$): 3320 (br), 2921, 1679 (br), 1558, 1445, 1350, 1020, 763, 731, 700 cm$^{-1}$; HRMS-LC/ESI (m/z) Calc'd for (C$_{18}$H$_{21}$N$_2$O$^+$) ([M+H]$^+$): 281.1648; found: 281.1654.

Example 3: Kinetic Characterization of Tetrazine/Cyclooctyne Reaction

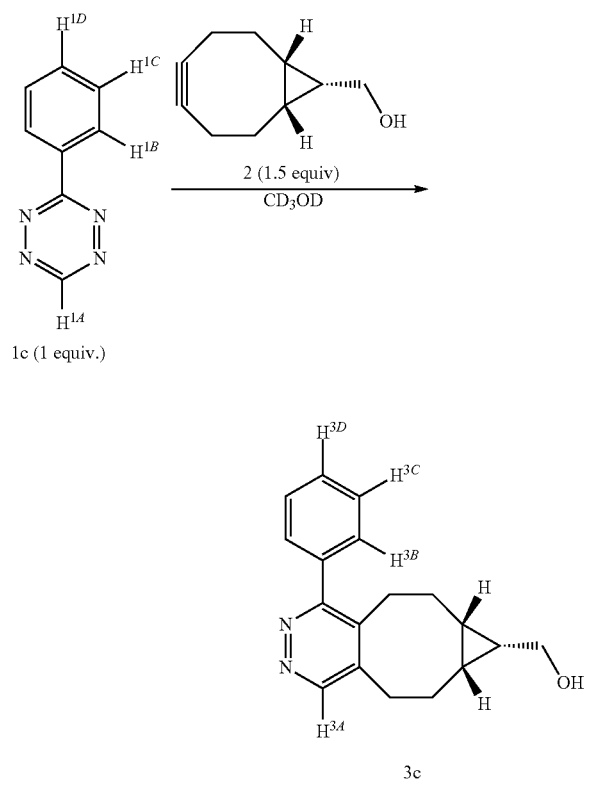

Figure 4:
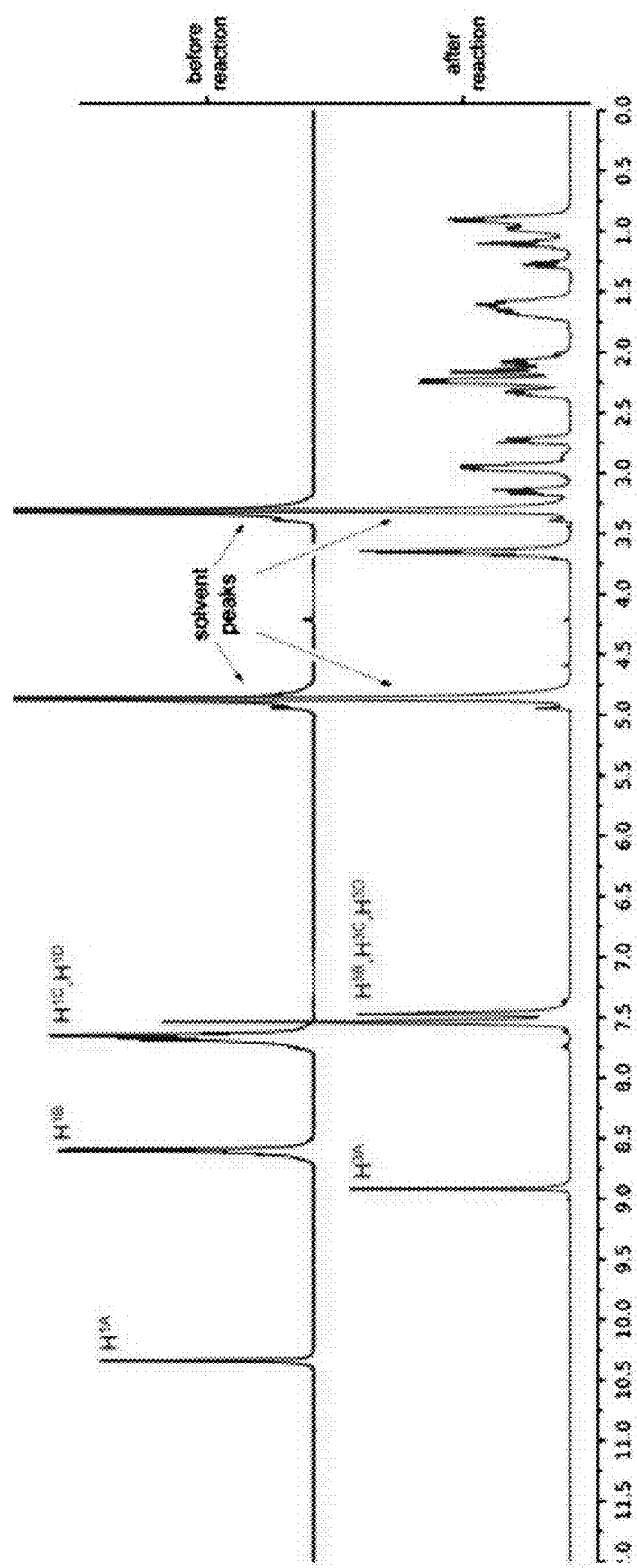
FIG. 4 depicts NMR spectra for hyperpolarized tetrazine and the product of a cycloaddition reaction between the hyperpolarized tetrazine and a cyclooctyne.

Emulating hyperpolarization conditions (below), a 1.5 mM solution of 1c (1 equivalent) in CD$_3$OD (400 μL) was added to an NMR tube. To this solution, a 4.5 mM solution of 2 (1.5 equivalent) in CD$_3$OD (200 μL) was added and the NMR tube was shaken vigorously. Immediately upon addition, the color of the solution changed from pink (due to the pink color of the tetrazine 1c) to colorless. As soon as the pink color completely dissipated (<2 seconds), the sample was placed into the NMR and a spectrum was acquired. A spectral comparison of 1c with 3c is shown in FIG. 4. The upper trace represents 1c and the lower trace represents 3c, i.e., the product of the cycloaddition reaction.

Example 4: Hyperpolarization Protocols

1. Hyperpolarization Setup.

Figure 5:
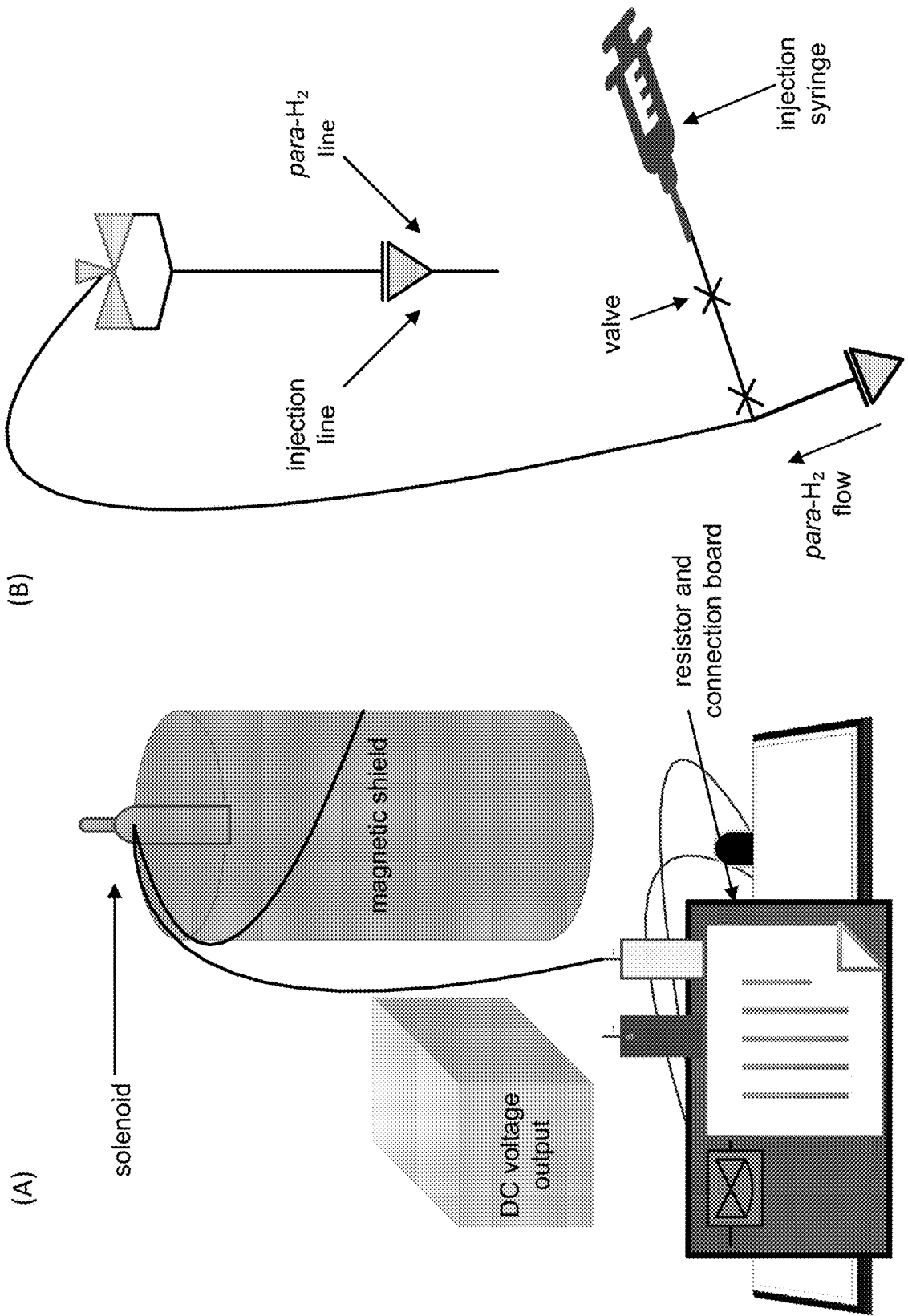
FIG. 5 shows a representative apparatus setup for hyperpolarization and hyperpolarized reaction experiments. Panel (A) shows the device used to hyperpolarize the tetrazine precursors, composed of: a DC voltage output, a magnetic shield, a solenoid, and a resistor. Panel (B) shows the sample tube and the injection line, together with the para-$H_2$ flow line.

FIG. 5 shows a representative apparatus setup for hyperpolarization and hyperpolarized reaction experiments. Panel (A) shows the DC voltage output, magnetic shield, solenoid, and resistor. Panel (B) shows the sample tube and the injection line, together with the para-H$_2$ flow line used for the SABRE-SHEATH process.

Normal H$_2$ gas is converted to para-H$_2$ (enrichment ~90.2%) using a commercial para-H$_2$ generator. The para-H$_2$ gas is delivered to the sample solution through a capillary at a pressure of about 100 psi. The magnetically shielded environment was prepared using a 3-layer μ-metal magnetic shield. A solenoid placed inside the shield controls the magnetic field via manual adjustment of the voltage using a DC voltage output and a resistor. A separate capillary for the injection of a secondary solution was added adjacent to the para-H$_2$ delivery line, with a valve placed at the site of injection to seal the pressure when bubbling gas.

2. Sample Preparation.

Unless otherwise described, a solution of $^{15}$N-enriched tetrazine (1a or 1b, 1.5 mM), pyridine (1.0 mM), and Ir(IMes)(COD) Cl (0.15 mM) in methanol-d$_4$ (400 μL) was prepared. Note: IMes=1,3-bis(2,4,6-trimethylphenyl) imidazol-2-ylidene; COD=1,5-cyclooctadiene.

3. Tetrazine Hyperpolarization Procedure.

The Ir catalyst was pre-activated by bubbling para-H$_2$ through a solution of tetrazine, pyridine, and Ir catalyst (sample preparation described above) for 30 minutes. Following pre-activation, the tetrazine was hyperpolarized, either magnetization or singlet order.

To hyperpolarize magnetization, the solution was placed inside the magnetic shield, with the magnetic field adjusted to 0.4 μT (using a solenoid of 430 mm with 205 turns and a voltage of 7.5 V across 11.4 kOhms). After 3 minutes' bubbling of para-H$_2$, the gas flow was stopped and the sample was manually transferred from the low field to an 8.5 T spectrometer for signal read out as quickly as possible. This manual transfer takes ~8 seconds, and a 90° pulse-acquire sequence was used for read out.

To hyperpolarize singlet, the sample was placed at a magnetic field of 0.3 mT and para-H$_2$ was bubbled through the solution for 3 minutes. As described in the above procedure, the sample was then manually transferred to an 8.5 T spectrometer as quickly as possible and detected using a 90° pulse-acquire sequence.

4. Tetrazine Hyperpolarization and Cycloaddition Reaction Procedure.

For the hyperpolarization of the cycloaddition products 3a and 3b, a solution of tetrazine (1a or 1b, respectively), pyridine, and Ir catalyst in methanol-d$_4$ was first hyperpolarized at 0.4 μT or 0.3 mT, depending on which spin order was studied (solution preparation and hyperpolarization procedure described above in Example 4). After hyperpolarization, the para-H$_2$ gas flow was stopped and the pressure was released through the exhaust outlet, after which the injection valve (shown in FIG. 5) was quickly opened to inject a solution of cyclooctyne 2 (4.5 mM) in methanol-d$_4$ (200 μL) (equiv of tetrazine:2=1.0:1.5). Injection was completed in less than 1 second, and the sample was shaken for 3 seconds to reach complete reaction, visually evidenced by the color change from pink (i.e., the color of the tetrazine) to transparent. The sample was then manually transferred to an 8.5 T spectrometer for product signal read out.

Example 5: Concentration Dependence of Tetrazine Hyperpolarization

The influence of solution concentration on the enhancement and lifetime of both tetrazine magnetization and singlet hyperpolarization was studied.

Using serial dilution, solutions of tetrazine 1a, pyridine, and Ir catalyst in methanol-$d_4$ (400 µL) were prepared at different concentrations, but in the same ratio of each component:

(i) 1a (7.5 mM), pyridine (5.0 mM), and Ir(IMES)(COD)Cl (0.75 mM)
  (ii) 1a (3.8 mM), pyridine (2.5 mM), and Ir(IMES)(COD)Cl (0.38 mM)
  (iii) 1a (1.5 mM), pyridine (1.0 mM), and Ir(IMES)(COD)Cl (0.15 mM) (i.e., default concentrations of solution used in all other experiments)
  (iv) 1a (0.60 mM), pyridine (0.40 mM), and Ir(IMES)(COD)Cl (0.060 mM)

Figure 6A:
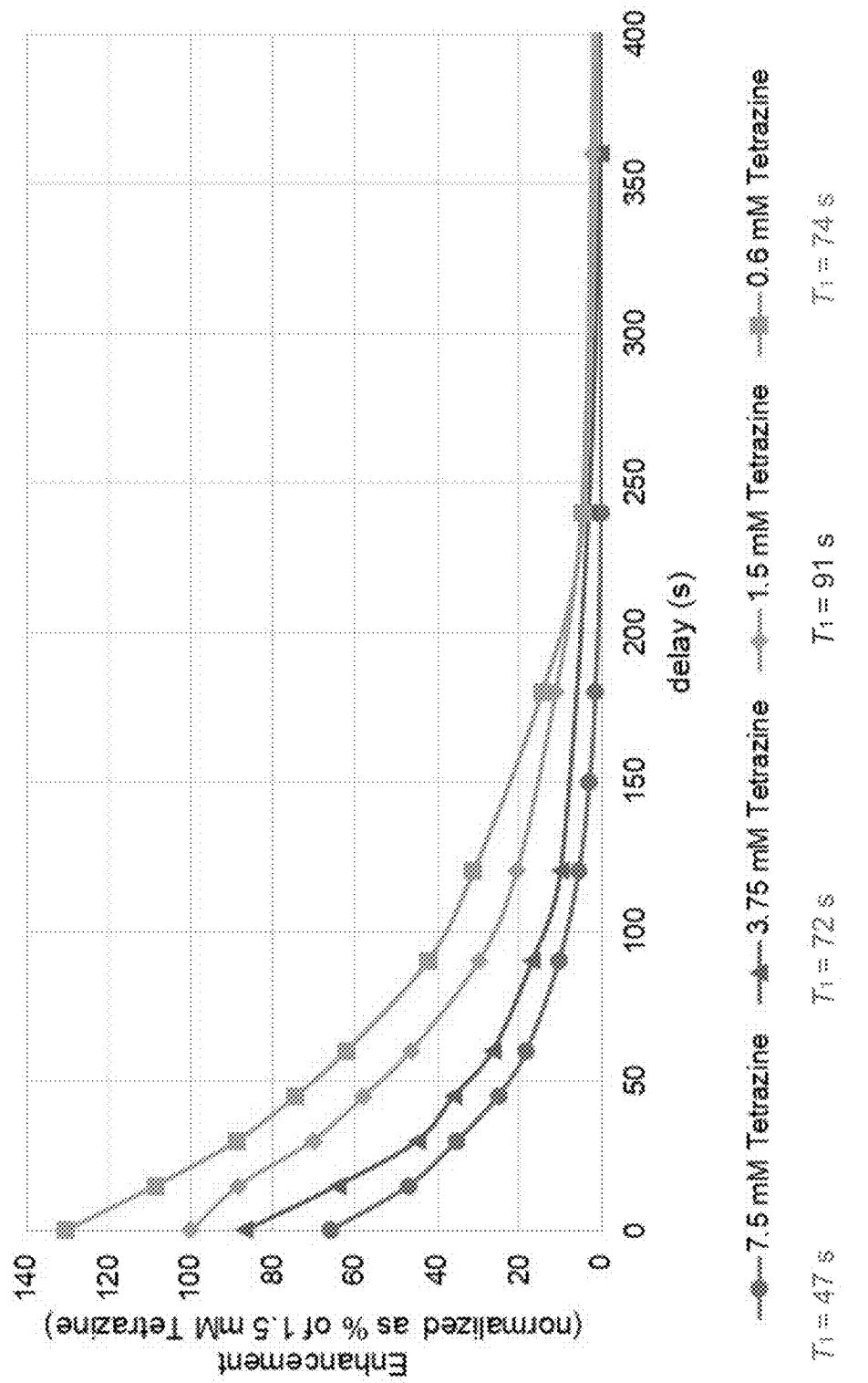
FIG. 6a is a graph of hyperpolarized signal decay of magnetization at variable concentrations.

For the rest of this section, samples are referred to by the concentration of tetrazine 1a comprising the solution. As described above, either magnetization or singlet tetrazine hyperpolarization was developed following pre-activation of the catalyst. After bubbling para-$H_2$ through the sample, the sample was transferred to 0.3 mT for a variable period of time. Following this delay, the sample was transported to the magnet and the spectrum was immediately recorded with a 90° pulse-acquire sequence. Triplet magnetization signal was deconvoluted from singlet signal, and fitted to a single exponential decay. Results are shown below in Table 1 and graphically in FIGS. 6a and 6b.

TABLE 1

Magnetization and singlet enhancements and lifetimes at variable concentrations

| Tetrazine (1a) Concentration (mM) | Z-Magnetization enhancement at 0 s delay (normalized to 1.5 mM Z-magnetization, %) | T1 (s) | Singlet enhancement at 0 s delay (normalized to 1.5 mM singlet, %) | Ts (s) |
|---|---|---|---|---|
| 7.5 | 66 | 47 | 56 | 48 |
| 3.75 | 86 | 72 | 77 | 58 |
| 1.5 | 100 | 91 | 100 | 137 |
| 0.60 | 130 | 74 | 96 | 357 |

(Note: 1.5 mM tetrazine is the concentration used in all other experiments described.)

Example 6: Magnetic Field Dependence of Tetrazine Hyperpolarization

The magnetic field dependence of hyperpolarization was studied in the following set of experiments. We found that the magnetization only polarizes in the low-field environment that is created inside the shield, and that there is a sharp drop in magnetization hyperpolarization at higher fields. From the magnified inset in FIG. 7, we can see that the magnetization polarization reaches its maximum at a magnetic field of ~0.3 µT.

In contrast, the singlet spin order is hyperpolarized in a very broad range of magnetic fields, from 0.2 mT to 100 mT. Bubbling the sample at ~3 mT yields the best signal; however, for experimental convenience, we chose to use 0.3 mT as our standard magnetic field for singlet hyperpolarization, which gives similar signal strength to that at 3 mT. The field dependence results are shown in FIG. 7.

FIG. 7 shows that the magnetization can only be hyperpolarized at very low magnetic fields, while the singlet has a much broader resonance condition. The magnified inset shows that, in the low-field region, the magnetization and singlet spin order have opposite polarization patterns: when one increases, the other decreases. Though the singlet has broad resonance condition, the optimal field is ~3 mT, and as the strength of the magnetic field is increased to very high values, the polarization level drops significantly.

Example 7: Dilution Effect on Hyperpolarization

Figure 8:
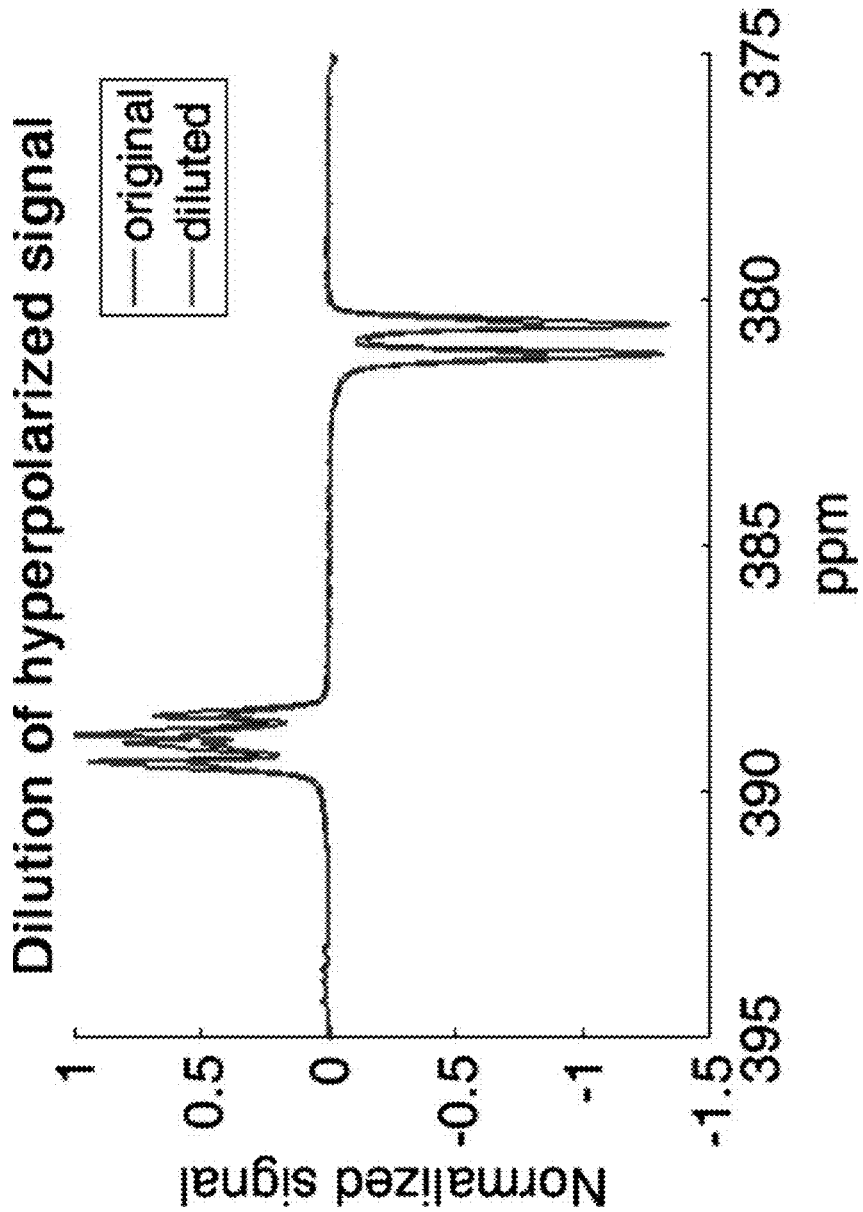
FIG. 8 is a graph comparing the originally hyperpolarized singlet and diluted signal.

To observe the effect of simple dilution on hyperpolarization, pure methanol-$d_4$ was injected into a solution of hyperpolarized tetrazine to obtain a diluted hyperpolarized signal as follows: tetrazine 1a was hyperpolarized singlet order at 0.3 mT and the spectra were acquired (as described in Example 4). The sample was again bubbled with para-$H_2$ for 3 minutes at 0.3 mT, then the pressure was released and the injection valve was opened, after which 200 µL of methanol-$d_4$ was quickly injected and the sample was manually transferred into the magnet to read out the signal (detailed in Example 4, but with the key difference: pure methanol-$d_4$ used instead of a solution of 2 in methanol-$d_4$). The signal following dilution of the solution, overlapped with the signal before dilution, is shown in FIG. 8. Based on this dilution test, we can confirm that addition of methanol does not alter the hyperpolarized precursor, but it does quench the signal slightly. The signal observed was about half of the signal before addition.

Injection of 200 µL methanol-$d_4$ does not alter the signal, but does decrease its intensity by about two-fold. This test was performed using the hyperpolarized singlet because the injection introduces an additional ~3 seconds of delay (due to release of para-$H_2$ pressure and injection of methanol), which may have a larger effect for magnetization due to its short relaxation time.

Example 8: Injection and Detection with Small Tip Angle

In addition to using a 90° pulse-acquire sequence for detection after injection, experiments using small tip angles (15° or 11.25°) were conducted to acquire a series of detection within a short time window (~10 s), and to use that information to determine the relaxation lifetime of different spin orders of the hyperpolarized product. The results are shown in FIG. 9.

Figure 9:
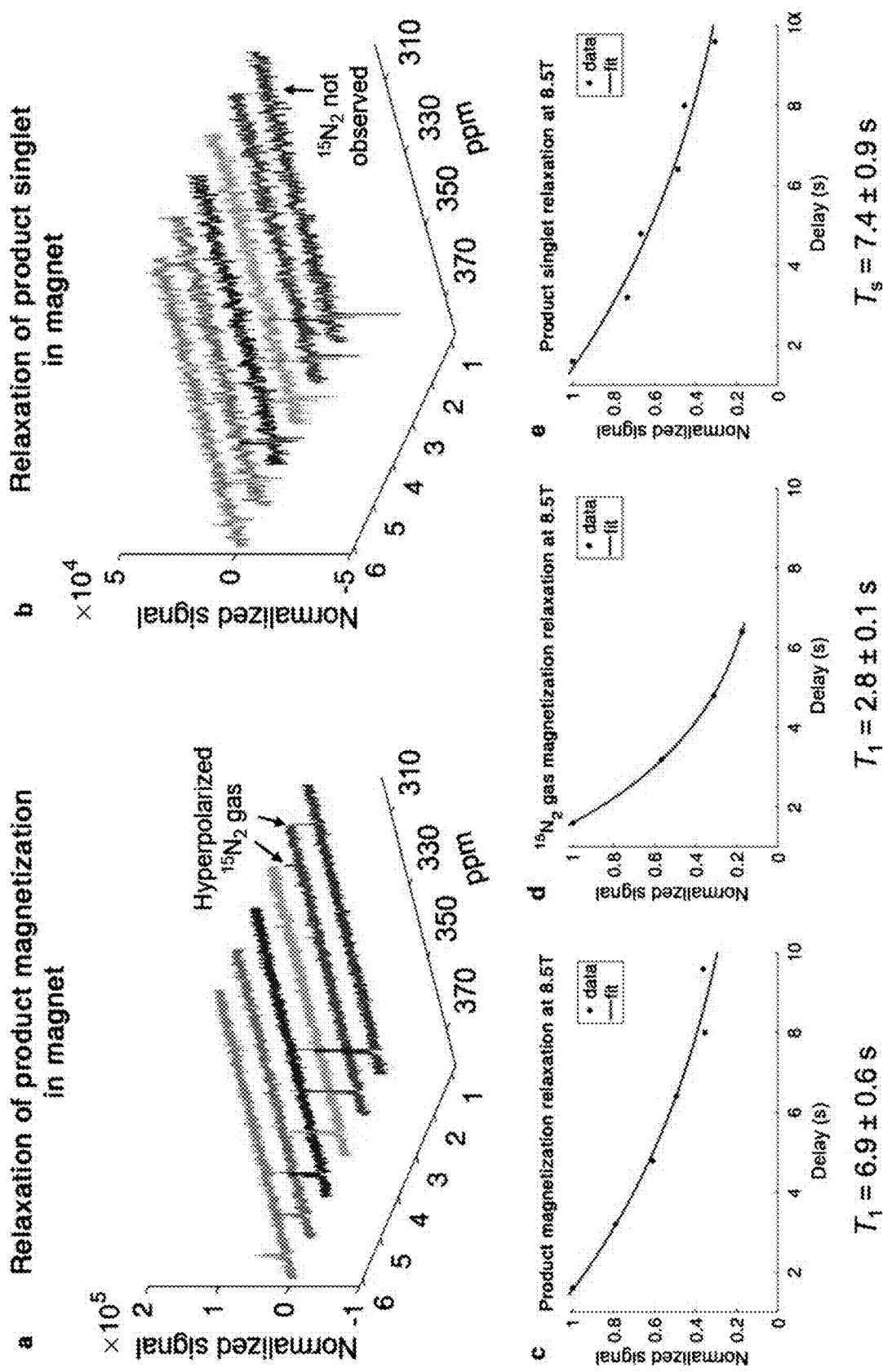

FIG. 9, panel a: magnetization of $^{15}$N-enriched tetrazine 1a is first hyperpolarized at 0.4 µT, then a solution of 2 in methanol-$d_4$ is injected (as described in Example 4). Then, the sample is manually transferred as quickly as possible into the magnet, using 15° tip angle to acquire 6 spectra consecutively, with a 1.6 s delay between each acquisition. The product shows in-phase signal at ~372 ppm, and at ~310 ppm, a singlet is visible corresponding to hyperpolarized $^{15}N_2$ gas in the first 4 spectra. Panel b: singlet spin order of $^{15}$N-enriched tetrazine 1a is first hyperpolarized at 0.3 mT, then a solution of 2 in methanol-$d_4$ is injected (as described in Example 4). Then, the sample is manually transferred as quickly as possible into the magnet, using 11.25° tip angle to acquire 6 spectra consecutively, with a 1.6 s delay between each acquisition. The product shows anti-phase signal at ~372 ppm, but at ~310 ppm there is no signal, indicating that para-$N_2$ is generated (thus yielding no $^{15}$N signal). Panels c-e: relaxation constant measurements of the hyperpolarized product magnetization, hyperpolarized $^{15}N_2$ gas, and hyperpolarized product singlet. The product magnetization has T1 lifetime of ~6.9 s.

Example 9: Hyperpolarization in Aqueous Media

Figure 10A:
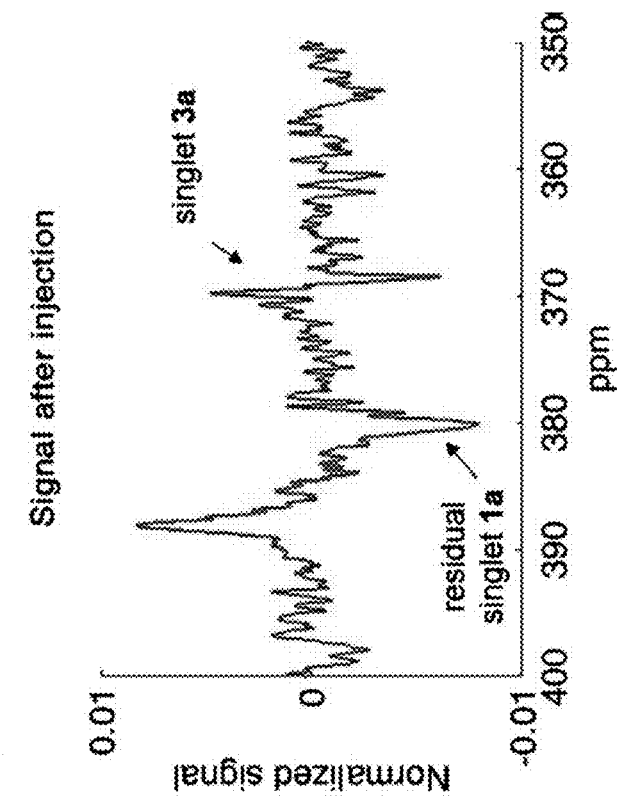
FIG. 10a is a graph showing the hyperpolarized tetrazine precursor signal from a signal amplification by reversible exchange in shield enables alignment transfer to heteronuclei (SABRE-SHEATH) experiment using methanol-$d_4$/$D_2O$ mixture as solvent.

One important aspect of our bioorthogonal reaction-promoted hyperpolarization approach is the ability to exploit this scheme using an aqueous solvent, which is critical for many biological reactions and would widely broaden the applicability of this strategy. An attempt to use $D_2O$ as a solvent at higher temperatures for tetrazine hyperpolarization did not result in hyperpolarization of substrates. The best results were achieved using a 3:1 methanol-$d_4$:$D_2O$ mixture and by elevating the temperature to about 50° C. using a water bath while bubbling para-$H_2$ through the solution. As shown in FIG. 10a, the tetrazine precursor 1a hyperpolarized with an enhancement of ~900 (p=0.27%), about 30% compared to that in neat methanol-$d_4$.

FIG. 10a shows that the $^{15}$N-tetrazine precursor can be hyperpolarized using the same protocol as described in Example 4.

Figure 10B:
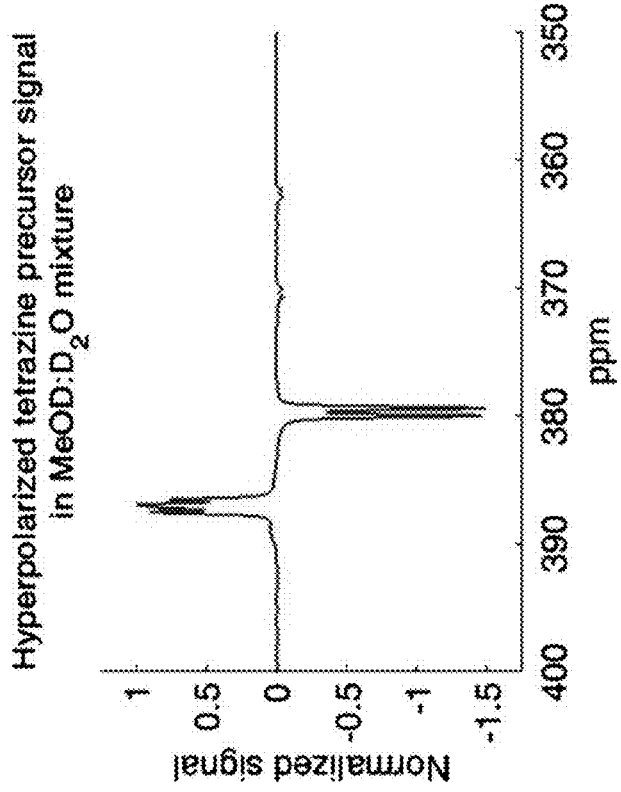
FIG. 10b is a graph of showing the hyperpolarized tetrazine precursor signal after injection.

A solution of 2 was prepared in the same 3:1 methanol-$d_4$:$D_2O$ mixed solvent and was injected after the hyperpolarization was established for the precursor tetrazine. However, the signal after injection is quite small: only ~1% of the hyperpolarized signal is observed as shown in FIG. 10b, and there a large amount of residual tetrazine remains.

Example 10: Tetrazine Hyperpolarization

FIG. 2a shows the structures of $^{15}$N$_4$-1,2,4,5-tetrazines 1a and 1b. FIG. 2b shows single-shot hyperpolarized spectra of tetrazines 1a and 1b at magnetization or singlet modes, with peak identifications, observed enhancement (ε), and polarization level (p). Depending on the magnetic field at which hyperpolarization was induced, in-phase signal (magnetization) or anti-phase signal (singlet) was observed. Enhancement values (ε) and polarization levels (p) were obtained by comparison of the hyperpolarized spectrum to a thermal reference spectrum of the respective $^{15}$N$_4$-1,2,4,5-tetrazine. FIG. 2c shows T1 and Ts lifetime curves for 1a and 1b. Measurement at 0.3 mT. Sample as a solution of $^{15}$N$_4$-1,2,4,5-tetrazine (1.5 mM), pyridine (1.0 mM), and Ir(COD)(IMes)Cl (0.15 mM) in methanol-$d_4$ (400 uL).

Hyperpolarization of 1a and 1b was examined by standard SABRE-SHEATH procedure, as reported by Theis et al. ("Direct and cost-efficient hyperpolarization of long-lived nuclear spin states on universal $^{15}$N$_2$-diazirine molecular tags," Sci. Adv. 2, e1501438 (2016)). Two different hyperpolarized states for $^{15}$N$_4$-1,2,4,5-tetrazine 1a were observed, depending upon the chosen magnetic field at which the para-hydrogen gas is applied to the sample (FIG. 2b). At very low magnetic fields (~0.4 μT), the $^{15}$N spin pairs of the tetrazine are hyperpolarized in the triplet states and display in-phase signal upon detection at 8.45 T (i.e., magnetization is hyperpolarized). Conversely, at a relatively broad range of slightly elevated magnetic fields (~0.2 mT<B<~50 mT), anti-phase signals are observed after a 90° pulse. In this case, scalar order is hyperpolarized in the tetrazine spin pairs, associated with singlet states on $^{15}$N-spin pairs; upon transfer to high magnetic field for detection, this scalar order is transformed into anti-aligned magnetization (I•S is adiabatically converted to $I_z$-$S_z$).

For tetrazine 1a, the signal enhancement over 8.45 T thermal measurements is up to 3,000-fold (0.9% polarization). At 0.3 mT, the magnetization has a relaxation constant $T_1$ of 1.4±0.1 min, and at the same field, the relaxation constant of the scalar order of the $^{15}$N spin pairs, $T_s$, is 2.7±0.3 min, indicating that the scalar order is protected from relaxation and has a lifetime about 2 times longer than magnetization. The enhancement level and lifetimes of the tetrazine 1b were also measured. The hyperpolarized scalar order yielded 2900-fold enhancement, with $T_s$ calculated to be 2.1±0.7 min at 0.3 mT (i.e., no significant change in lifetime within the error of the measurement). It was not possible to create the hyperpolarized magnetization for deuterated compound 1b (or to measure its $T_1$) because the quadrupolar deuterium quenches hyperpolarization at μT fields.

Figure 3:
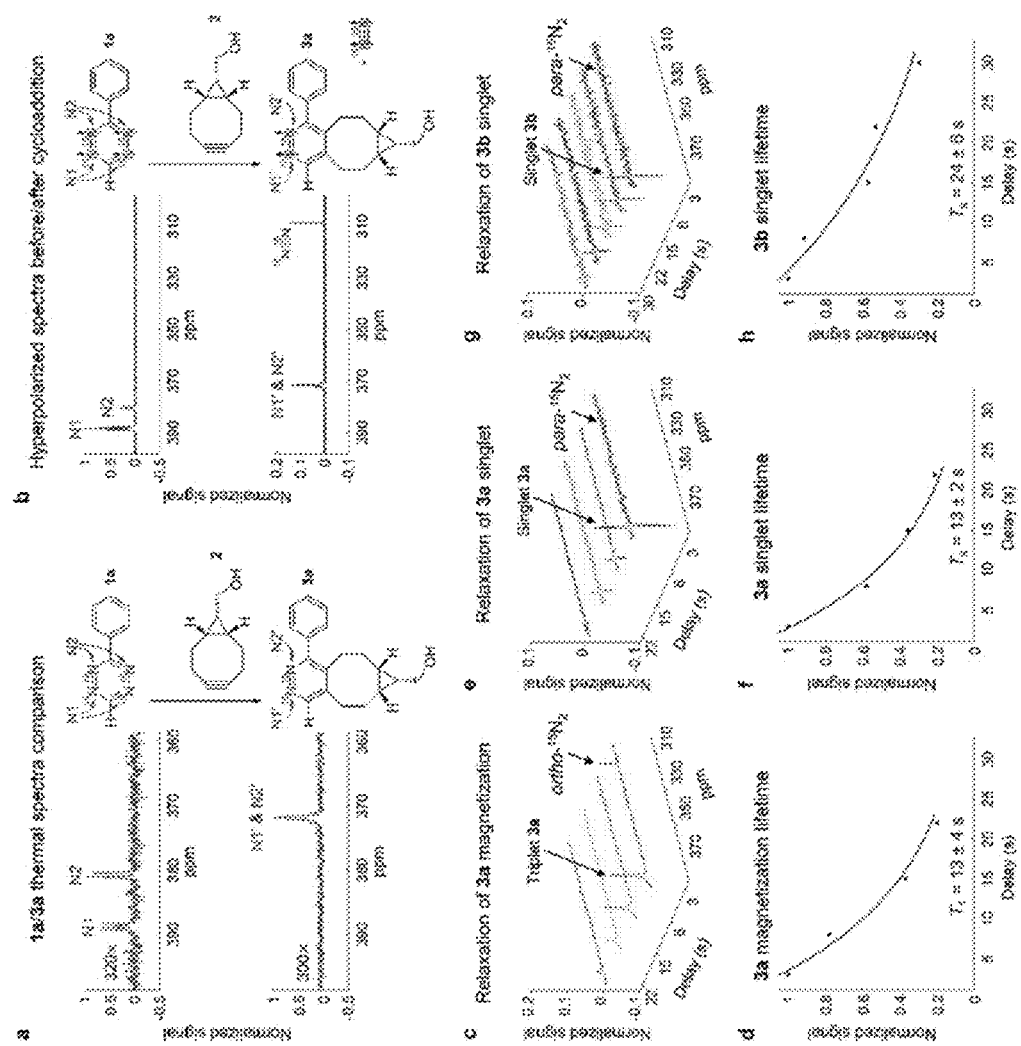
FIG. 3 shows schematics and graphs showing the inverse-demand Diels-Alder reaction (IEDDA) reaction and hyperpolarization transfer in accordance with one embodiment of the present disclosure.

Example 11: Bioorthogonal Reactions of Hyperpolarized $^{15}$N$_4$-1,2,4,5-tetrazines and Cyclooctyne FIG. 3, panel a, shows thermal spectra of tetrazine 1a, compared to thermal spectra of cycloaddition product 3a. Upon the cycloaddition reaction, a noticeable difference in chemical shift is observed on both nitrogen atoms (i.e., N1 and N2 in 1a vs. N1' and N2' in 3a). FIG. 3, panel b, shows spectra of hyperpolarized 1a and the spectra obtained after the addition of 2. Hyperpolarized 3a and $^{15}$N$_2$ are observed. FIG. 3, panels c, e, and g show representative $T_1$ or $T_s$ decay measurements for product 3a magnetization, 3a singlet order, and 3b singlet order, respectively. Note the presence of observable $^{15}$N$_2$ in the post-addition spectra when hyperpolarizing magnetization (FIG. 3, panel c), but absence of this peak in hyperpolarized singlet (FIG. 3, panels e, g), which strongly suggests singlet $^{15}$N$_2$ has been generated in these experiments. FIG. 3, panels d, f, and h show lifetime measurement data, exponential fit of the data, and calculated $T_1$ or $T_s$ values for product 3a magnetization, 3a singlet order, and 3b singlet order, respectively. In the hyperpolarization-cycloaddition experiments, para-hydrogen was bubbled into a solution of $^{15}$N$_4$-1,2,4,5-tetrazine 1a or 1b (1.5 mM), pyridine (1.0 mM), and Ir(COD)(IMes)Cl (0.15 mM) in methanol-$d_4$ (400 uL), then a solution of 2 (1.5 equivalents) in methanol-$d_4$ (200 μL) was added. The sample was held at 0.3 mT for a variable amount of time before transport to the magnet for detection.

The cycloaddition of 1a was first examined after hyperpolarizing magnetization (i.e., triplet states were hyperpolarized by bubbling at 0.4 μT prior to cycloaddition). After addition of a solution of 2 to a sample of hyperpolarized 1a at 0.3 mT and subsequent transfer to high field, sharp, in-phase peaks were observed at 372 ppm that matched the position and pattern of the peaks observed in the thermal spectra of product 3a (FIG. 3, b). An additional signal was detected at 310 ppm, which corresponds to hyperpolarized $^{15}$N$_2$ gas (thermal spectrum of $^{15}$N$_2$ in $CD_3OD$ discussed above. This data demonstrates that the IEDDA reaction of hyperpolarized $^{15}$N$_4$-tetrazine 1a successfully generates hyperpolarized $^{15}$N-containing products, including both $^{15}$N$_2$-pyridazine 3a and $^{15}$N$_2$ gas. Based on the spectrum of hyperpolarized products, an enhancement of 540-fold was calculated over their thermal spectra. The magnetization lifetime $T_1$ for 3a was determined to be 13±4 s, substantially shorter than that of tetrazine 1a (see FIG. 3, panels c and d).

Next, the reaction of 1a was examined after hyperpolarizing scalar order by bubbling at 0.3 mT (FIG. 3, panels e and f). After the solution of 2 was injected to the solution of hyperpolarized tetrazine at the same field (0.3 mT) and transferred to high field for detection, anti-phase peaks were observed at 372 ppm, with 140-fold signal enhancements over thermal spectra. The $T_s$ for 3a was determined to be 13±2 s, very similar in magnitude to $T_1$. This contrasts with the significant difference observed between $T_1$ and $T_s$ for the tetrazine 1a.

Furthermore, the effects of deuteration in the cycloaddition reaction and products were studied. As explained above, only scalar order could be hyperpolarized on the deuterated tetrazine 1b. Therefore, the study was restricted to measurements of $T_s$ in the deuterated product 3b. Very similar to the observation in the reaction of tetrazine 1a, anti-phase peaks at 372 ppm were detected with a similar enhancement level of 180-fold. A significantly longer lifetime $T_s$ of 24±6 seconds was obtained from the deuterated product (FIG. 3, panels g and h).

One key observation is that the $^{15}N_2$ gas signal at 310 ppm (FIG. 3, panels b and c) is absent with hyperpolarized scalar order (FIG. 3, panels e and g) after the cycloaddition reaction. The absence of nitrogen gas signals in this data provides indirect evidence for the generation of hyperpolarized para-nitrogen (p-$^{15}N_2$). Hyperpolarized p-$^{15}N_2$ is exceptionally long-lived and therefore particularly useful as a safe MRI agent. p-$^{15}N_2$ cannot be prepared in the same way as p-$H_2$ because the rotational constant of $N_2$ is small and the nitrogen freezes before it achieves significant para excess under conditions available with current procedures. Thus, the bioorthogonal reaction of hyperpolarized $^{15}N_4$-1,2,4,5-tetrazines represents an improved method for preparing this material.

With 3:1 $CD_3OD$: $D_2O$ as a co-solvent system, hyperpolarization of tetrazine 1a was achieved with ~900-fold signal enhancement at 50° C., and also detected the hyperpolarized signal from the cycloaddition product 3a under these conditions. These results demonstrate that this strategy can be applied to studies under aqueous conditions.

Example 12: In Vitro Imaging of Biotinylation at Cell Surface

Cells are plated in 48 well plates and transfected with a 15-amino acid acceptor peptide, which traffics to the cell surface. Recombinantly expressed biotin ligase is added to the cell medium with ATP and biotin, thereby biotinylating the acceptor peptide on the cell surface. Excess biotin is removed by washing.

Monovalent streptavidin conjugated to cyclooctyne is then added, and binds the biotinylated surface proteins. Cells are washed a few times to remove excess streptavidin. A $^{15}N_4$-enriched 1,2,4,5-tetrazine of the disclosure is hyperpolarized according to the procedure provided in Example 4 to obtain hyperpolarized $^{15}N_4$-1,2,4,5-tetrazine. The hyperpolarized $^{15}N_4$-1,2,4,5-tetrazine is immediately added to the cells having the cyclooctyne moiety, and the IEDDA reaction proceeds immediately. Cells are then imaged using MRI.

Any patents or publications mentioned in this specification are indicative of the levels of those skilled in the art to which the invention pertains. These patents and publications are herein incorporated by reference to the same extent as if each individual publication was specifically and individually indicated to be incorporated by reference. In case of conflict, the present specification, including definitions, will control.

One skilled in the art will readily appreciate that the invention is well adapted to carry out the objects and obtain the ends and advantages mentioned, as well as those inherent therein. The present disclosure described herein, including disclosed embodiments, are exemplary, and are not intended as limitations on the scope of the invention. Changes therein and other uses will occur to those skilled in the art which are encompassed within the spirit of the invention as defined by the scope of the claims.

I claim:

1. A method of preparing hyperpolarized $^{15}N_2$ gas, the method comprising:
   contacting (1) a target molecule comprising a bioorthogonal reactive moiety with (2) a bioorthogonal tag comprising hyperpolarized $^{15}N$ atoms under conditions suitable for the bioorthogonal reactive moiety to undergo a coupling reaction with the biorthogonal tag to produce hyperpolarized $^{15}N_2$ gas.

2. The method of claim 1, wherein the hyperpolarized $^{15}N_2$ gas is hyperpolarized para-$^{15}N_2$ gas.

3. The method of claim 1, wherein the coupling reaction of the bioorthogonal reactive moiety and the biorthogonal tag additionally produces a hyperpolarized target molecule.

4. The method of claim 1, further comprising hyperpolarizing a $^{15}N$-enriched bioorthogonal tag to obtain the bioorthogonal tag comprising hyperpolarized $^{15}N$ atoms.

5. The method of claim 4, wherein the hyperpolarization of $^{15}N$ atoms is carried out by signal amplification by reversible exchange (SABRE) method.

6. The method of claim 4, wherein the hyperpolarization of $^{15}N$ atoms is carried out by dynamic nuclear polarization (DNP) method.

7. The method of claim 4, wherein the $^{15}N$-enriched bioorthogonal tag is an optionally substituted $^{15}N$-1,2,4,5-tetrazine.

8. The method of claim 7, wherein the $^{15}N$-1,2,4,5-tetrazine is of formula (I):

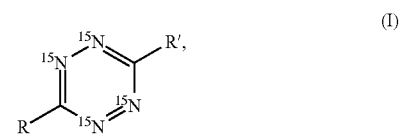

wherein
   R is selected from hydrogen, deuterium, —CN, $C_1$-$C_{12}$ alkyl optionally substituted with one or more $R^1$, $C_2$-$C_{12}$ alkenyl optionally substituted with one or more $R^1$, $C_2$-$C_{12}$ alkynyl optionally substituted with one or more $R^1$, $C_3$-$C_{12}$ cycloalkyl optionally substituted with one or more $R^2$, aryl optionally substituted with one or more $R^2$, and heteroaryl optionally substituted with one or more $R^2$, where
   each $R^1$ is independently selected from deuterium, halogen, —CN, —$N_3$, —$N(R^5)_2$, and —$OR^5$,
   each $R^2$ is independently selected from deuterium, halogen, —CN, —$N_3$, $C_1$-$C_6$ alkyl, $C_2$-$C_6$ alkenyl, $C_2$-$C_6$ alkynyl, $C_1$-$C_6$ haloalkyl, —$N(R^5)_2$, and —$OR^5$; and
   R' is selected from hydrogen, deuterium, —CN, $C_1$-$C_{12}$ alkyl optionally substituted with one or more $R^3$, $C_2$-$C_{12}$ alkenyl optionally substituted with one or more $R^3$, $C_2$-$C_{12}$ alkynyl optionally substituted with one or more $R^3$, $C_1$-$C_6$ haloalkyl, $C_3$-$C_{12}$ cycloalkyl optionally substituted with one or more $R^4$, aryl optionally substituted with one or more $R^4$, and heteroaryl optionally substituted with one or more $R^4$, where
each $R^3$ is independently selected from deuterium, halogen, —CN, —$N_3$, —$N(R^5)_2$, and —$OR^5$,
each $R^4$ is independently selected from deuterium, halogen, —CN, —$N_3$, $C_1$-$C_6$ alkyl, $C_2$-$C_6$ alkenyl, $C_2$-$C_6$ alkynyl, $C_1$-$C_6$ haloalkyl, —$N(R^5)_2$, and —$OR^5$,
wherein each $R^5$ is independently hydrogen, deuterium, or $C_1$-$C_6$ alkyl.

9. The method of claim 7, wherein the $^{15}$N-1,2,4,5-tetrazine is:
3-phenyl-1,2,4,5-tetrazine-1,2,4,5-$^{15}N_4$; or
3-phenyl-1,2,4,5-tetrazine-6-d-1,2,4,5-$^{15}N_4$.

10. The method of claim 1, wherein the bioorthogonal reactive moiety in the target molecule is trans-cyclooctene, cyclooctyne, or norbornene moiety.

11. The method of claim 1, wherein the target molecule is a member of a binding pair.

12. A method of in vitro or in vivo sensing, the method comprising:
providing (1) a target molecule comprising a bioorthogonal reactive moiety and (2) a bioorthogonal tag comprising hyperpolarized $^{15}$N atoms to a sample or a subject, under conditions suitable for the bioorthogonal reactive moiety to undergo a coupling reaction with the biorthogonal tag to produce hyperpolarized target molecule and hyperpolarized $^{15}N_2$ gas;
allowing for at least a portion of the hyperpolarized target molecule and/or hyperpolarized $^{15}N_2$ gas to be modulated in the sample or the subject; and
detecting hyperpolarized $^{15}$N atoms by $^{15}$N-magnetic resonance to determine modulation.

13. The method of claim 12, wherein the hyperpolarized target molecule is modulated by binding to a partner moiety.

14. The method of claim 12, wherein the hyperpolarized $^{15}N_2$ gas is modulated by complexing to a metal-containing target ligand.

* * * * *